US012713806B2

(12) United States Patent
Kim et al.

(10) Patent No.: US 12,713,806 B2
(45) Date of Patent: Aug. 18, 2026

(54) DISPLAY APPARATUS

(71) Applicant: Samsung Display Co., Ltd., Yongin-si (KR)

(72) Inventors: Daehyeon Kim, Yongin-si (KR); Changmin Lee, Yongin-si (KR); Hyunshik Lee, Yongin-si (KR); Hongil Kim, Yongin-si (KR); Jaehoon Hwang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 289 days.

(21) Appl. No.: 18/505,122

(22) Filed: Nov. 9, 2023

(65) Prior Publication Data

US 2024/0172515 A1 May 23, 2024

(30) Foreign Application Priority Data

Nov. 23, 2022 (KR) ........................ 10-2022-0158529

(51) Int. Cl.
*H01L 33/00* (2010.01)
*H10K 59/38* (2023.01)
*H10K 59/80* (2023.01)

(52) U.S. Cl.
CPC ......... *H10K 59/38* (2023.02); *H10K 59/8731* (2023.02)

(58) Field of Classification Search
CPC .... H10K 59/38; H10K 59/8731; H10K 50/19; H10K 59/352; H10K 59/353;
(Continued)

(56) References Cited

U.S. PATENT DOCUMENTS 5,818,550 A 10/1998 Kadota et al.
6,278,507 B1 8/2001 Nakamura
(Continued)

FOREIGN PATENT DOCUMENTS

EP 3958324 A2 2/2022
JP 2017-027872 2/2017
(Continued)

OTHER PUBLICATIONS

Korean International Search Report for International Application No. PCT/KR2023/018497, dated Feb. 22, 2024.

*Primary Examiner* — Niki H Nguyen
(74) *Attorney, Agent, or Firm* — CANTOR COLBURN LLP

(57) ABSTRACT

A display apparatus includes a first pixel electrode and a second pixel electrode disposed on the first substrate, an intermediate layer disposed on the first pixel electrode and the second pixel electrode and emitting a first light, an opposite electrode disposed on the intermediate layer, a first color filter disposed on the opposite electrode and overlapping the first pixel electrode in plan view, an organic material layer disposed between the opposite electrode and the first color filter, and a second color filter disposed on the opposite electrode and overlapping the second pixel electrode in plan view, and the first light has an X-value in a range of about 0.220 to about 0.222 and a Y-value in a range of about 0.225 to about 0.309 in CIE color coordinates, and the first light passes through the organic material layer along a substantially linear path.

22 Claims, 22 Drawing Sheets

(58) Field of Classification Search
CPC ........ H10K 50/13; H10K 50/17; H10K 50/81; H10K 50/82; H10K 50/844; H10K 50/854; H10K 59/1213; H10K 59/122; H10K 59/123; H10K 59/879; H10H 20/855; H10H 29/142; H10H 20/8513; H10H 20/8514; H10H 20/814; H10H 20/819; H10H 20/8312; H10H 20/84; H10H 20/85; H10H 20/856
See application file for complete search history.

(56) References Cited

U.S. PATENT DOCUMENTS

| | | | | |
|---|---|---|---|---|
| 7,791,271 | B2 | 9/2010 | Cok et al. | |
| 9,431,463 | B2 | 8/2016 | Choi | |
| 9,853,231 | B2 | 12/2017 | Jung et al. | |
| 10,797,112 | B2 | 10/2020 | Hack et al. | |
| 10,923,538 | B2 * | 2/2021 | Lee | H10K 59/87 |
| 10,971,557 | B2 | 4/2021 | Jeong et al. | |
| 2010/0188611 | A1 | 7/2010 | Wang et al. | |
| 2014/0062292 | A1 * | 3/2014 | Seong | H10K 59/873<br>313/504 |
| 2015/0003043 | A1 | 1/2015 | Ke | |
| 2016/0202546 | A1 | 7/2016 | Kim et al. | |
| 2020/0019029 | A1 | 1/2020 | Park et al. | |
| 2020/0058888 | A1 | 2/2020 | Sugiyama et al. | |
| 2020/0168668 | A1 * | 5/2020 | Kim | H10K 50/856 |
| 2022/0037608 | A1 | 2/2022 | Ichikawa | |
| 2023/0209962 | A1 | 6/2023 | Seong et al. | |

FOREIGN PATENT DOCUMENTS

| | | |
|---|---|---|
| KR | 10-2017-0026950 | 3/2017 |
| KR | 10-2020-0025980 | 3/2020 |
| KR | 10-2151609 | 9/2020 |
| KR | 10-2021-0114938 | 9/2021 |
| KR | 10-2021-0135971 | 11/2021 |
| KR | 10-2325381 | 11/2021 |
| KR | 10-2021-0153191 | 12/2021 |
| KR | 10-2022-0070391 | 5/2022 |
| KR | 10-2022-0093875 | 7/2022 |

* cited by examiner

FIG. 10

| $t_{320}$ (Å) | RED | | | GREEN | | | BLUE | | | | WHITE | |
|---|---|---|---|---|---|---|---|---|---|---|---|---|
| | R_x | R_y | R_Eff | G_x | G_y | G_Eff | B_x | B_y | B_Eff | B_con | W_Eff | |
| 3300 | 0.701 | 0.295 | 10.2 | 0.228 | 0.735 | 43.6 | 0.153 | 0.031 | 4.6 | 145.6 | 20.6 | 90.7% |
| 3350 | 0.701 | 0.295 | 10.2 | 0.230 | 0.733 | 44.6 | 0.151 | 0.029 | 5.7 | 194.7 | 22.4 | 98.7% |
| 3400 | 0.701 | 0.296 | 10.3 | 0.231 | 0.732 | 44.5 | 0.151 | 0.030 | 6.0 | 201.4 | 22.6 | 99.6% |
| 3450 | 0.701 | 0.296 | 10.4 | 0.231 | 0.732 | 44.7 | 0.151 | 0.030 | 6.3 | 209.6 | 22.7 | 100.0% |
| 3500 | 0.701 | 0.296 | 10.4 | 0.232 | 0.732 | 44.3 | 0.147 | 0.034 | 7.1 | 204.8 | 22.5 | 99.1% |
| 3550 | 0.700 | 0.296 | 10.7 | 0.232 | 0.731 | 43.5 | 0.146 | 0.035 | 7.6 | 194.9 | 21.8 | 96.0% |
| 3600 | 0.700 | 0.297 | 10.7 | 0.232 | 0.732 | 42.9 | 0.142 | 0.041 | 7.8 | 188.1 | 21.2 | 93.4% |
| 3650 | 0.700 | 0.297 | 10.8 | 0.232 | 0.731 | 41.3 | 0.137 | 0.053 | 7.9 | 118.1 | 19.6 | 86.3% |
| 3700 | 0.699 | 0.298 | 10.6 | 0.232 | 0.731 | 41.0 | 0.133 | 0.060 | 6.9 | 115.4 | 19.0 | 83.7% |
| 3750 | 0.699 | 0.298 | 10.6 | 0.232 | 0.731 | 41.0 | 0.135 | 0.057 | 6.3 | 110.7 | 18.8 | 82.8% |
| 3800 | 0.701 | 0.296 | 10.9 | 0.224 | 0.734 | 22.0 | 0.151 | 0.030 | 5.9 | 195.0 | 16.3 | 71.8% |
| 3850 | 0.701 | 0.296 | 6.9 | 0.215 | 0.742 | 27.3 | 0.138 | 0.061 | 5.7 | 93.2 | 13.1 | 57.7% |

FIG. 12

| $t_{320}$(Å) | LIGHT SOURCE COLOR COORDINATES | | WHITE | |
|---|---|---|---|---|
| | CIEx | CIEy | W_Eff | |
| 3300 | 0.215 | 0.378 | 20.6 | 90.7% |
| 3350 | 0.220 | 0.309 | 22.4 | 98.7% |
| 3400 | 0.221 | 0.274 | 22.6 | 99.6% |
| 3450 | 0.222 | 0.258 | 22.7 | 100.0% |
| 3500 | 0.220 | 0.225 | 22.5 | 99.1% |
| 3550 | 0.221 | 0.203 | 21.8 | 96.0% |
| 3600 | 0.226 | 0.200 | 21.2 | 93.4% |
| 3650 | 0.235 | 0.206 | 19.6 | 86.3% |
| 3700 | 0.243 | 0.215 | 19.0 | 83.7% |
| 3750 | 0.230 | 0.219 | 18.8 | 82.8% |
| 3800 | 0.234 | 0.239 | 16.3 | 71.8% |
| 3850 | 0.238 | 0.271 | 13.1 | 57.7% |

DISPLAY APPARATUS

CROSS-REFERENCE TO RELATED APPLICATION

This application claims priority to and benefits of Korean Patent Application No. 10-2022-0158529 under 35 U.S.C. § 119, filed on Nov. 23, 2022, in the Korean Intellectual Property Office, the entire contents of which are incorporated herein by reference.

BACKGROUND

1. Technical Field

One or more embodiments relate to a display apparatus, and, to a display apparatus in which high-quality images are displayed.

2. Description of the Related Art

Display apparatuses have pixels. The pixels can emit light of different colors for a full-color display apparatus. To this end, at least some pixels of the display apparatus may have a color conversion portion. Thus, light of a first color generated by a light-emitting portion of some pixels is converted into light of a second color while passing through a corresponding color conversion portion and is extracted to the outside.

However, in a display apparatus according to the related art, a high-quality image cannot be displayed due to low light efficiency.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display apparatus in which high-quality images are displayed. However, these are examples, and the scope of the disclosure is not limited thereby.

Additional aspects will be set forth in part in the description which follows and, in part, will be apparent from the description, or may be learned by practice of the embodiments.

The technical objectives to be achieved by the disclosure are not limited to those described herein, and other technical objectives that are not mentioned herein would be clearly understood by a person skilled in the art from the description of the disclosure.

According to an aspect of the disclosure, a display apparatus may include a first pixel electrode and a second pixel electrode disposed on a substrate; an intermediate layer disposed on the first pixel electrode and the second pixel electrode and emitting a first light; an opposite electrode disposed on the intermediate layer; a first color filter (also referred to as a first color filter layer) disposed on the opposite electrode and overlapping the first pixel electrode in plan view; an organic material layer disposed between the opposite electrode and the first color filter; and a second color filter (also referred to as a second color filter layer) disposed on the opposite electrode and overlapping the second pixel electrode in plan view, wherein the first light has an X-value in a range of about 0.220 to about 0.222 and a Y-value in a range of about 0.225 to about 0.309 in CIE color coordinates, and the first light passes through the organic material layer along a substantially linear path.

A light-emitting spectrum intensity of the first light may have a first peak value that is a local maximum value in a wavelength band in a range of about 440 nm to about 460 nm, and in case that a measurement angle of the light-emitting spectrum intensity is changed based on a direction perpendicular to the substrate, the first peak value continuously decreases according to an increase of the measurement angle.

The first color filter may include scattering particles.

The display apparatus may further include an encapsulation layer disposed on the opposite electrode and including at least one inorganic encapsulation layer and one organic encapsulation layer, wherein the refractive index of the at least one organic material layer may be substantially equal to the refractive index of the organic encapsulation layer.

The display apparatus may further include a filling material disposed between the encapsulation layer, and the first color filter and the second color filter, and a protection layer disposed between the organic material layer and the filling material.

The display apparatus may further include a filling material disposed between the encapsulation layer, and the first color filter and the second color filter, and the organic material layer may be integral with the filling material.

The intermediate layer may include a first emission layer, a second emission layer, a third emission layer, and a fourth emission layer, and the first emission layer, the second emission layer, and the third emission layer may emit blue light, and the fourth emission layer may emit green light.

Each of the first emission layer, the second emission layer, and the third emission layer may emit light having a wavelength in a range of about 400 nm to about 500 nm, and the fourth emission layer may emit light having a wavelength in a range of about 500 nm to about 600 nm.

The intermediate layer may include at least one hole injection layer, and a distance between a first interface between the first pixel electrode and the intermediate layer and a second interface between the intermediate layer and the opposite electrode may be in a range of about 3350 Å to about 3500 Å.

The display apparatus may further include a first color conversion layer disposed between the opposite electrode and the second color filter and converts the first light into light having a wavelength of a second wavelength band, and the first color filter may pass through only light having a wavelength belonging to a first wavelength band, and the second color filter may pass through only light having a wavelength belonging to the second wavelength band.

The display apparatus may further include a third pixel electrode disposed on the substrate and a third color filter (also referred to as a third color filter layer) disposed on the opposite electrode to overlap the third pixel electrode in plan view and passing through only light having a wavelength belonging to a third wavelength band.

The display apparatus may further include a second color conversion layer disposed between the opposite electrode and the third color filter and converts the first light into light having a wavelength of a third wavelength band.

The third color filter may include scattering particles.

According to an aspect of the disclosure, a display apparatus may include; a first pixel electrode and a second pixel electrode disposed on a first substrate; an intermediate layer disposed on the first pixel electrode and the second pixel electrode and emits a first light; an opposite electrode disposed on the intermediate layer; a second substrate disposed above the first substate with the opposite electrode disposed between the first substrate and the second substrate; a bank disposed on a lower surface of the second substrate in a direction of the first substrate and having a first bank opening overlapping the first pixel electrode in plan view, and a second bank opening overlapping the second pixel electrode in plan view; a first color filter disposed between the bank and the second substrate and overlapping the first pixel electrode in plan view; an organic material layer disposed between the opposite electrode and the first color filter; and a second color filter disposed between the bank and the second substrate and overlapping the second pixel electrode in plan view, wherein the first light has an X-value in a range of about 0.220 to about 0.222 in CIE color coordinates, and the first light passes through the organic material layer along a substantially linear path.

A light-emitting spectrum intensity of the first light may have a first peak value that is a local maximum value in a wavelength band in a range of about 440 nm to about 460 nm, and in case that a measurement angle of the light-emitting spectrum intensity is changed based on a direction perpendicular to the first substrate, the first peak value continuously decreases according to an increase of the measurement angle.

The first color filter may include scattering particles.

The display apparatus may further include an encapsulation layer disposed on the opposite electrode and including at least one inorganic encapsulation layer and one organic encapsulation layer, wherein the refractive index of the organic material layer may be same as the refractive index of the organic encapsulation layer.

The intermediate layer may include a first emission layer, a second emission layer, a third emission layer, and a fourth emission layer, which overlap in plan view, and the first emission layer, the second emission layer, and the third emission layer may emit blue light, and the fourth emission layer may emit green light.

Each of the first emission layer, the second emission layer, and the third emission layer may emit light having a maximum emission wavelength in a range of about 400 nm to about 500 nm, and the fourth emission layer may emit light having a maximum emission wavelength in a range of about 500 nm to about 600 nm.

The intermediate layer may include at least one hole injection layer, and a distance between a first interface between the pixel electrode and the intermediate layer and a second interface between the intermediate layer and the opposite electrode may be in a range of about 3350 Å to about 3500 Å.

The display apparatus may further include a filling material disposed between the first color filter and the second color filter, and the opposite electrode, and the organic material layer may be integral with the filling material.

The filling material may bury the first bank opening.

Other aspects, features, advantages other than those described above will become apparent from the following drawings, claims, and detailed description of the disclosure.

BRIEF DESCRIPTION OF THE DRAWINGS

The above and other aspects, features, and advantages of the disclosure will be more apparent from the following description taken in conjunction with the accompanying drawings, in which:

FIG. 10 is a table showing color coordinates, light-emitting efficiency and white light-emitting efficiency of light emitted by each pixel of a display apparatus according to a thickness change of an intermediate layer;

FIG. 12 is a graph showing light source color coordinates and white light-emitting efficiency of a display apparatus according to a thickness change of an intermediate layer.

DETAILED DESCRIPTION OF THE EMBODIMENTS

Figure 1:
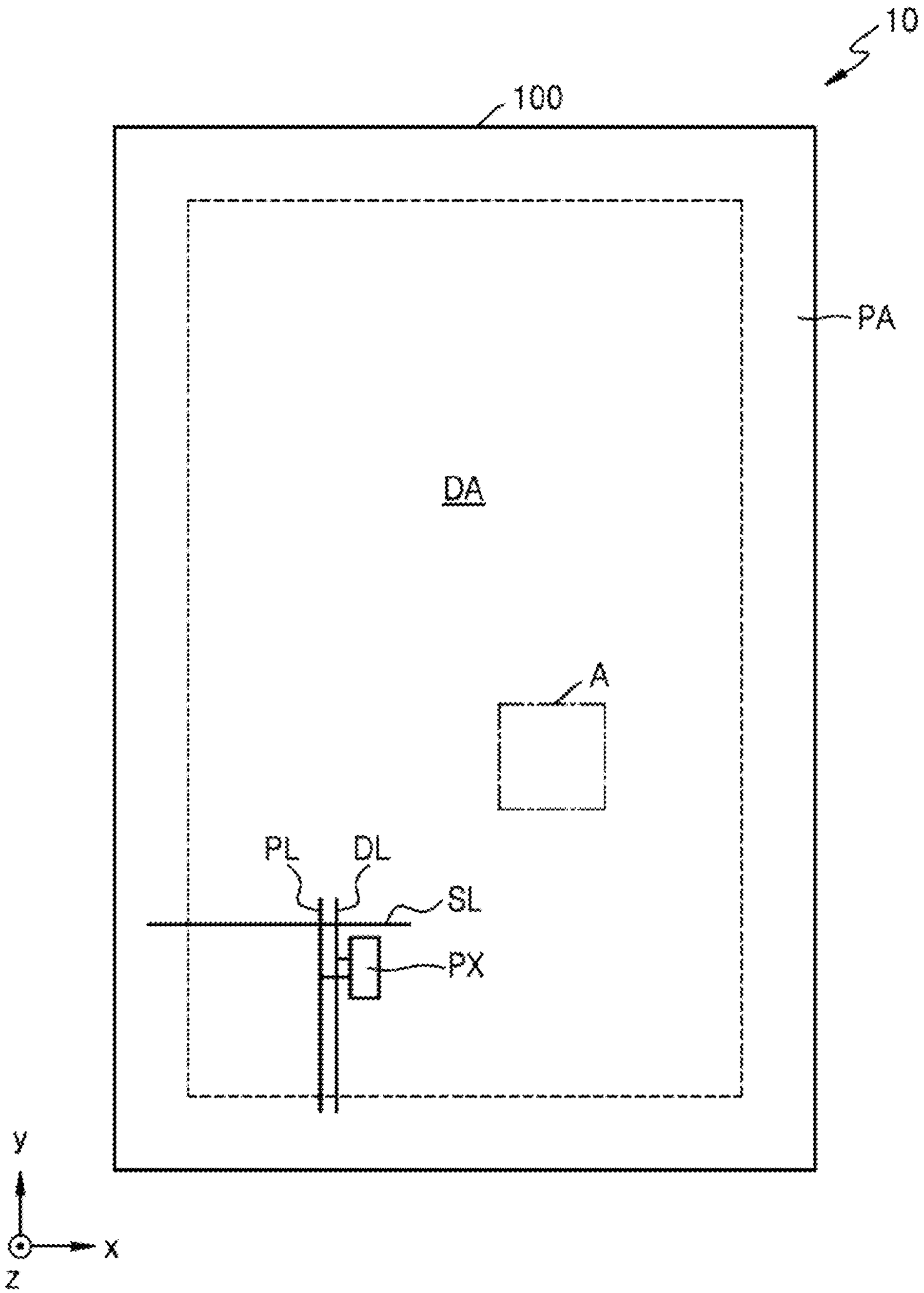
FIG. 1 is a schematic plan view schematically illustrating a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are described below, by referring to the figures, to explain aspects of the description.

In the drawings, sizes, thicknesses, ratios, and dimensions of the elements may be exaggerated for ease of description and for clarity. Like numbers refer to like elements throughout.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Since various modifications and various embodiments are possible, example embodiments are illustrated in the drawings and described in detail in the detailed description. Effects and features of the disclosure, and a method of achieving them will be apparent with reference to embodiments described below in detail in conjunction with the drawings. However, the disclosure is not limited to the embodiments disclosed herein, but may be implemented in a variety of forms.

Hereinafter, embodiments will be described in detail with reference to the accompanying drawings, and the same or corresponding components are denoted by the same reference numerals, and the same reference numerals are assigned and redundant explanations may be omitted.

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

As used herein, the singular forms, "a," "an," and "the" are intended to include the plural forms as well, unless the context clearly indicates otherwise.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

In the specification, the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

In the specification, when a portion such as a layer, a region, a component or the like is on other portions, this is not only when the portion is on other components, but also when other components are interposed therebetween.

In the specification, when a layer, a region, a component, etc. are connected to each other, the layer, the region, and the components may be directly connected to each other and/or the layer, the region, and the components may be indirectly connected to each other with other layers, other regions and other components interposed between the layer, the region, and the components. For example, when a layer, a region, a component, etc. are electrically connected to each other in the specification, the layer, the region, the component, etc. may be directly electrically connected to each other, and/or the layer, the region, the component, etc. may be indirectly electrically connected to each other with other layers, other regions and other components interposed between the layer, the region, and the components.

The x-axis, the y-axis, and the z-axis are not limited to three axes on a Cartesian coordinate system, and may be interpreted in a broad sense including the same. For example, the x-axis, the y-axis, and the z-axis may be perpendicular to each other, but may refer to different directions that are not orthogonal to each other.

In the specification, in the case where an embodiment may be implemented in the specification, a specific process order may be performed differently from the order described. For example, two processes described in succession may be substantially performed at the same time, or in an opposite order to an order to be described.

In the specification, an "intermediate layer" is the term that represents a single and/or a multitude of all layers arranged between a pixel electrode and an opposite electrode of a light emitting device.

In the drawings, for convenience of explanation, the sizes of components may be exaggerated or reduced. For example, since the size and thickness of each component shown in the drawings are arbitrarily indicated for convenience of explanation, the disclosure is not necessarily limited to the illustration.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view schematically illustrating a display apparatus according to an embodiment. As shown in FIG. 1, the display apparatus according to an embodiment may include a display panel 10. As long as the display apparatus may include the display panel 10, any display apparatus is possible. For example, the display apparatus may be a variety of apparatuses such as smartphones, tablets, laptop computers, televisions, or advertisement boards.

The display panel 10 may include a display area DA and a peripheral area PA outside the display area DA. In FIG. 1, the display area DA has a rectangular shape. However, embodiments are not limited thereto. The display area DA may have other shapes such as a circular shape, an elliptical shape, a polygonal shape, another figure shape, and the like within the spirit and the scope of the disclosure.

The display area DA may be a portion in which an image is displayed, and pixels PX may be arranged (or disposed) in the display area DA. Each pixel PX may include a display element such as an organic light-emitting diode. Each pixel PX may emit red light, green light, or blue light, for example. The pixel PX may be connected to a pixel circuit including a thin film transistor (TFT), a storage capacitor, or the like within the spirit and the scope of the disclosure. The pixel circuit may be connected to a scan line SL to transmit a scan signal, a data line DL intersecting the scan line SL and to transmit a data signal, and a driving voltage line PL to supply a driving voltage. The scan line SL may extend in an x-direction, and the data line DL and the driving voltage line PL may extend in a y-direction.

The pixel PX may emit light having luminance corresponding to an electrical signal from the electrically-connected pixel circuit. In the display area DA, a given image may be displayed through light emitted by the pixel PX. For reference, the pixel PX may be defined as a region in which light of one color of red, green and blue is emitted, as described above.

The peripheral area PA that is an area in which the pixel PX is not arranged may be an area in which an image is not displayed. A power supply wiring or the like for driving the pixel PX may be located (or disposed) in the peripheral area PA. In an embodiment, a terminal portion to which a printed circuit board including a driving circuit portion or a driver integrated circuit (IC) is connected may be arranged in the peripheral area PA.

For reference, because the display panel 10 may include a first substrate 100, the first substrate 100 may have the display area DA and the peripheral area PA.

Figure 2A:
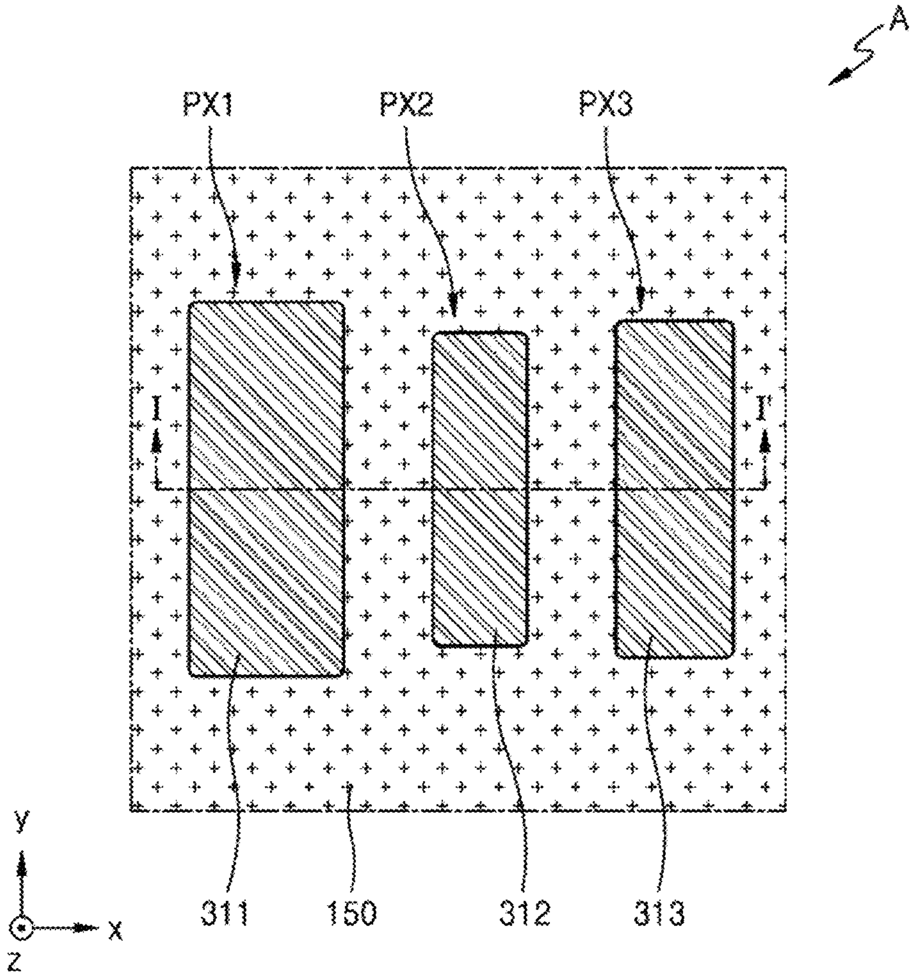
FIGS. 2A, 2B, and 2C are schematic plan views schematically illustrating a portion of a display apparatus according to embodiments.
Figure 2B:
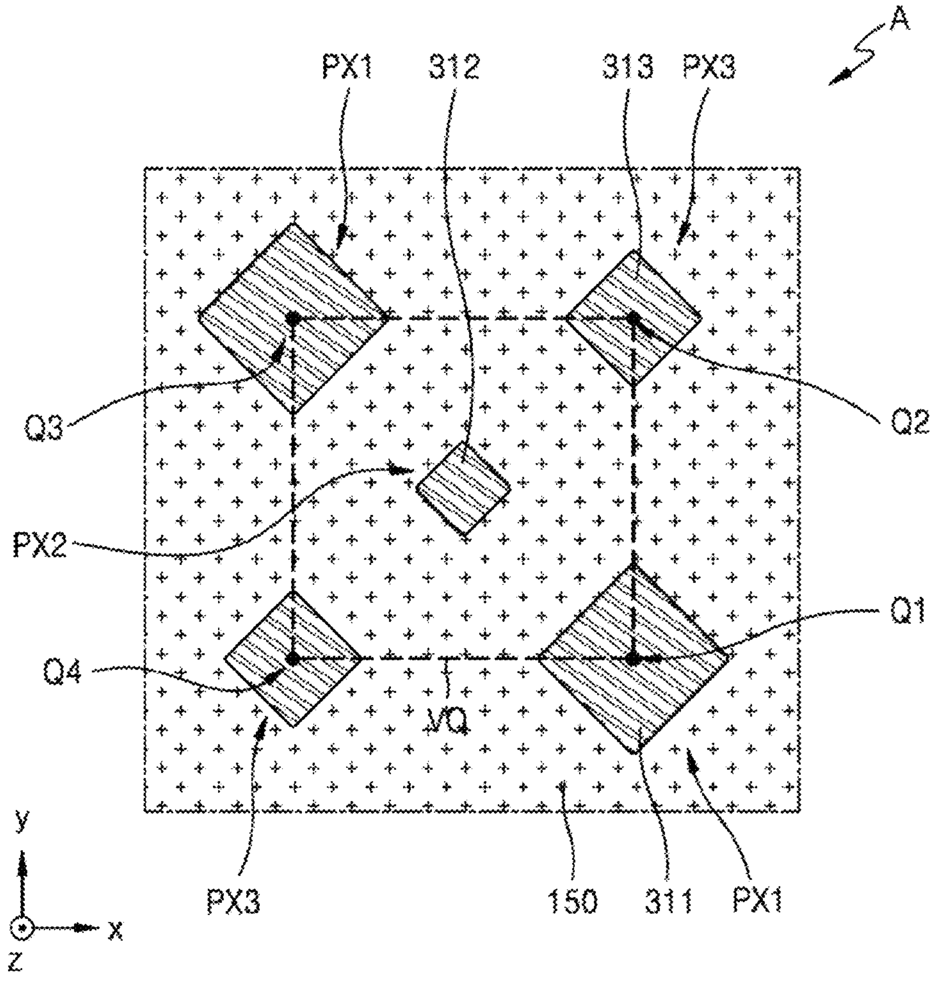
Figure 2C:
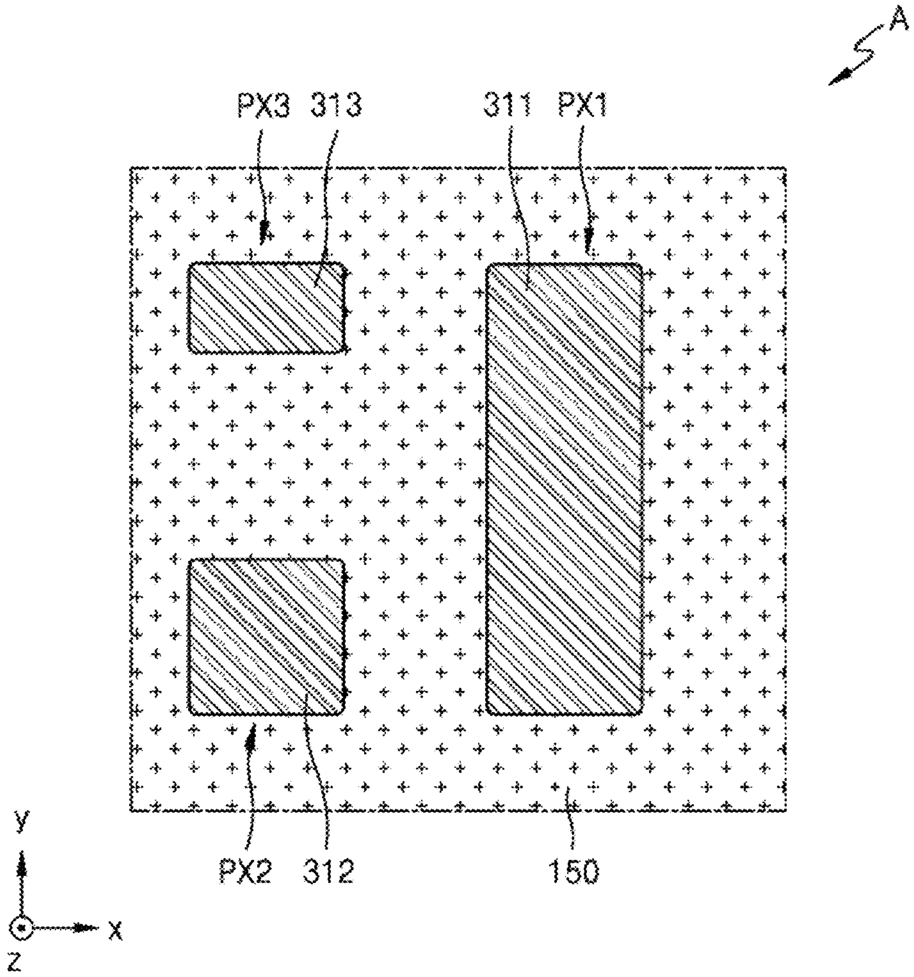

FIGS. 2A, 2B, and 2C are schematic plan views schematically illustrating a portion of a display apparatus according to embodiments. FIGS. 2A, 2B, and 2C are enlarged schematic plan views of region A of the display panel 10 of FIG. 1.

As shown in FIGS. 2A, 2B, and 2C, the display apparatus may include pixels PX. The pixels PX may include a first pixel PX1, a second pixel PX2, and a third pixel PX3, which emit light of different colors. The first pixel PX1 may be a pixel that emits blue light, the second pixel PX2 may be a pixel that emits red light, and the third pixel PX3 may be a pixel that emits green light.

Each of the first pixel PX1, the second pixel PX2, and the third pixel PX3 may have a polygonal shape in case that viewed from a direction (z-axis direction) perpendicular to the first substrate 100. FIGS. 2A, 2B, and 2C illustrate that, in case that each of the first pixel PX1, the second pixel PX2 and the third pixel PX3 has a rectangular shape, by way of example, a rectangular shape with round edges in case that viewed from the direction (z-axis direction) perpendicular to the first substrate 100. However, embodiments are not limited thereto. For example, each of the first pixel PX1, the second pixel PX2, and the third pixel PX3 may have a circular shape or an elliptical shape in case that viewed from the direction (z-axis direction) perpendicular to the first substrate 100.

The sizes of the first pixel PX1, the second pixel PX2, and the third pixel PX3, for example, the areas thereof, may be different from each other. For example, the area of the second pixel PX2 may be smaller than the area of the first pixel PX1 and the area of the third pixel PX3. However, embodiments are not limited thereto. For example, the areas of the first pixel PX1, the second pixel PX2, and the third pixel PX3 may also be substantially the same.

The first pixel PX1 may include a first pixel electrode 311, and the second pixel PX2 may include a second pixel electrode 312, and the third pixel PX3 may include a third pixel electrode 313. A pixel-defining layer 150 may cover edges of each of the first pixel electrode 311, the second pixel electrode 312, and the third pixel electrode 313. For example, the pixel-defining layer 150 may have an opening for exposing the center of the first pixel electrode 311, an opening for exposing the center of the second pixel electrode 312, and an opening for exposing the center of the third pixel electrode 313.

As shown in FIG. 2A that is a schematic plan view schematically illustrating a portion of the display apparatus according to an embodiment, the first pixel PX1, the second pixel PX2, and the third pixel PX3 may also be arranged in a stripe manner. For example, the first pixel PX1, the second pixel PX2, and the third pixel PX3 may be sequentially arranged in the x-axis direction. Of course, embodiments are not limited to the case where the first pixel PX1, the second pixel PX2 and the third pixel PX3 are arranged in a stripe manner.

For example, as shown in FIG. 2B that is a schematic plan view schematically illustrating a portion of the display apparatus according to an embodiment, the first pixel PX1, the second pixel PX2, and the third pixel PX3 may also be arranged in a pentile PENTILE™ manner. For example, in case that assuming a virtual rectangle VQ centered on the center of the second pixel PX2, the first pixel PX1 may be disposed at a first vertex Q1, and the third pixel PX3 may be disposed at a second vertex Q2 adjacent to the first vertex Q1. The first pixel PX1 may be disposed at the third vertex Q3 that is symmetrical to the first vertex Q1 centered on the center of the virtual rectangle VQ, and the third pixel PX3 may be disposed at the fourth vertex Q4 that is symmetrical to the second vertex Q2 centered on the center of the virtual rectangle VQ. The virtual rectangle VQ may have a square shape. The first pixel PX1 and the third pixel PX3 may be alternately arranged in the x-axis direction and the y-axis direction intersecting the x-axis direction. For example, a set of first pixels PX1, a set of second pixels PX2, and a set of third pixels PX3 may be repeatedly positioned in the x-axis direction and may also be repeatedly positioned in the y-axis direction. Thus, the second pixel PX2 may be surrounded by the first pixels PX1 and the third pixels PX3.

As shown in FIG. 2C that is a schematic plan view schematically illustrating a portion of the display apparatus according to an embodiment, the first pixel PX1, the second pixel PX2, and the third pixel PX3 may also be arranged in an S-stripe manner. The second pixel PX2 and the third pixel PX3 may be alternately positioned in the y-axis direction, and a pair of the second pixel PX2 and the third pixel PX3 and the first pixel PX1 may be alternately positioned in the x-axis direction. Of course, unlike this, pixels PX may also be arranged in a mosaic manner.

In case that viewed from a direction (z-axis direction) perpendicular to the first substrate 100, a shape of each of the first pixel PX1, the second pixel PX2, and the third pixel PX3 may be defined by a first color filter layer (see 810 of FIG. 5), a second color filter layer (see 820 of FIG. 5) and/or a third color filter layer (see 830 of FIG. 5) as described below. In an embodiment, a portion exposed by the pixel-defining layer 150 of each of the first pixel electrode 311 of the first pixel PX1, the second pixel electrode 312 of the second pixel PX2, and the third pixel electrode 313 of the third pixel PX3 may be different from the shape of each of the first pixel PX1, the second pixel PX2, and the third pixel PX3 defined by the first color filter layer 810, the second color filter layer 820 and/or the third color filter layer 830.

Figure 3:
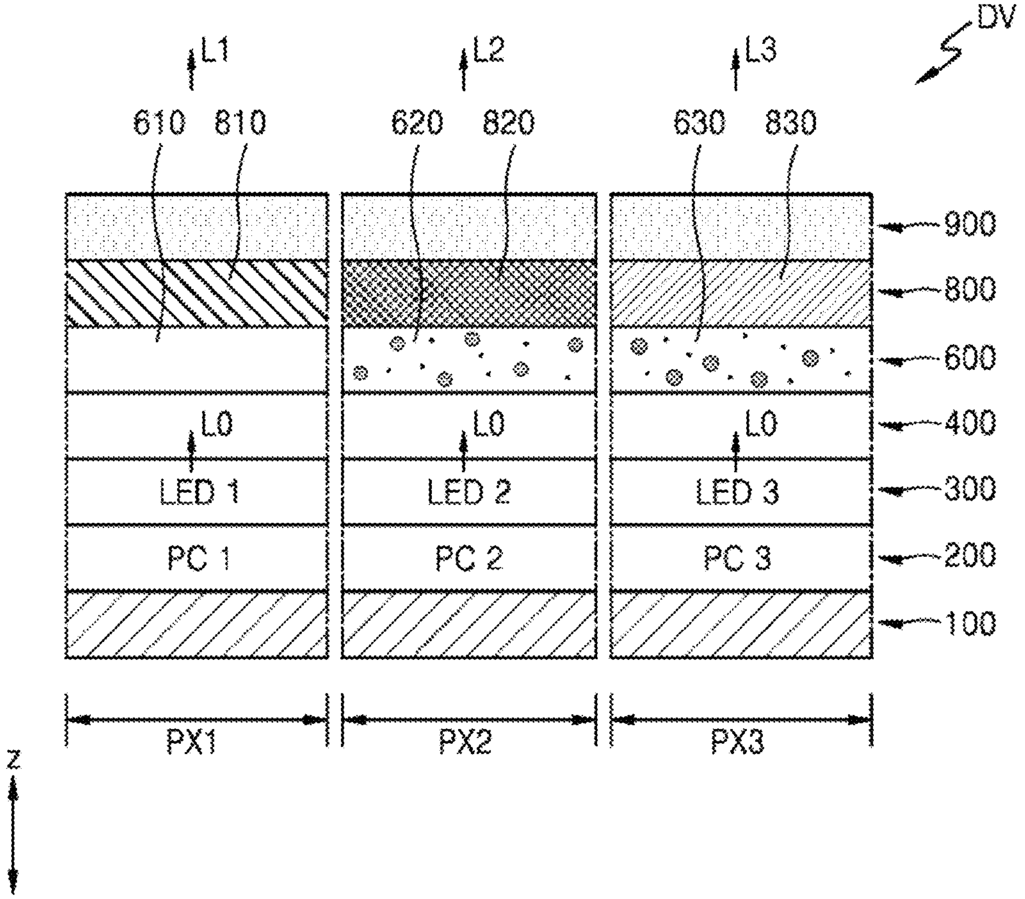
FIG. 3 is a schematic cross-sectional view schematically illustrating pixels of a display apparatus according to an embodiment.

FIG. 3 is a schematic cross-sectional view schematically illustrating pixels of a display apparatus according to an embodiment.

Referring to FIG. 3, a display apparatus DV may include a circuit layer 200 on the first substrate 100. The circuit layer 200 may include a first pixel circuit PC1, a second pixel circuit PC2, and a third pixel circuit PC3, and each of the first pixel circuit PC1, the second pixel circuit PC2, and the third pixel circuit PC3 may be electrically connected to a first light emitting device LED1, a second light emitting device LED2, and a third light emitting device LED3 of a light emitting element layer 300.

The first light emitting device LED1, the second light emitting device LED2, and the third light emitting device LED3 may include an organic light emitting diode including an organic material. The first light emitting device LED1, the second light emitting device LED2, and the third light emitting device LED3 may emit light of a same color. For example, first light L0 emitted by the first light emitting device LED1, the second light emitting device LED2, and the third light emitting device LED3 may pass through an encapsulation layer 400 on the light emitting element layer 300 to pass through a color conversion-transparent layer 600. The first light L0 may have an X-value of 0.220 to 0.222 and may have a Y-value of 0.225 to 0.309 in CIE color coordinates. The CIE color coordinates are color coordinates defined by the International Commission on Illumination (CIE) standard for the international determination regarding the lateral light and the lateral color.

The color conversion-transparent layer 600 may include color conversion portions for converting the first light L0 emitted by the light emitting element layer 300 into light having a wavelength corresponding to a different wavelength band, and an organic material layer 610 for passing the first light L0 emitted by the light emitting element layer 300 without color conversion.

In an embodiment, the first light L0 may have a wavelength corresponding to a first wavelength band. Here, the first wavelength band may be, for example, about 450 nm to about 495 nm. In the specification, A-light having a wavelength belonging to a B wavelength band with a given range means that the wavelength of a point having the maximum intensity value in a light-emitting spectrum for A-light belongs to the B wavelength band.

In an embodiment, the first light L0 may be mixed light of pieces of light having wavelengths belonging to different wavelength bands. For example, the first light L0 may be a mixed light of light blue and light of dark blue, or a mixed light of blue light and green light.

As shown in FIG. 3, the color conversion-transparent layer 600 may include an organic material layer 610 corresponding to the first pixel PX1, a first color conversion layer 620 corresponding to the second pixel PX2, and a second color conversion layer 630 corresponding to the third pixel PX3.

The organic material layer 610 may pass through the first light L0 emitted by the first light emitting device LED1 without conversion. The first light L0 may pass through the organic material layer 610 along a linear path. In the specification, "light passes through an A-layer along a linear path" means that light is not scattered by an optical interface inside the A-layer but passes through the A-layer along substantially linear path. The first color conversion layer 620 may convert the first light L0 emitted by the second light emitting device LED2 into third light L2 having a wavelength belonging to a second wavelength band. Similarly, the second color conversion layer 630 may convert the first light L0 emitted by the third light emitting device LED3 into fourth light L3 having a wavelength belonging to a third wavelength band. Here, the second wavelength band may be about 625 nm to about 780 nm, and the third wavelength band may be about 495 nm to about 570 nm. However, embodiments are not limited thereto, and the wavelength band of each of the first light L0, the third light L2, and the fourth light L3 may be modified unlike this.

In an embodiment, the second color conversion layer 630 may pass through the first light L0 emitted by the third light emitting device LED3 without color conversion. Similarly, in an embodiment, the first color conversion layer 620 may pass through the first light L0 emitted by the second light emitting device LED2 without color conversion.

The color filter layer 800 may be located on the color conversion-transparent layer 600. The color filter layer 800 may include a first color filter layer 810, a second color filter layer 820, and a third color filter layer 830 having different colors. For example, the first color filter layer 810 may be a layer for passing through only second light L1 having a wavelength belonging to about 450 nm to about 495 nm. The second color filter layer 820 may be a layer for passing through only third light L2 having a wavelength belonging to about 625 nm to about 780 nm. The third color filter layer 830 may be a layer for passing through only fourth light L3 having a wavelength belonging to about 495 nm to about 570 nm. The color filter layer 800 may increase color purity of light emitted to the outside, thereby improving the quality of an image to be displayed. The color filter layer 800 may reduce a ratio at which external light incident on the display apparatus DV from the outside is reflected from components below the color filter layer 800 and is emitted to the outside again, thereby reducing external light reflection.

In an embodiment, the first color filter layer 810 may include scattering particles. Here, the scattering particles may be metal oxide particles or organic particles. A metal oxide for scattering particles may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and a combination thereof. An organic material for scattering particles may include acryl-based resin, urethane-based resin, and a combination thereof. The scattering particles may scatter light in various directions regardless of an incident angle without substantially changing the wavelength of incident light. Thus, the scattering particles may improve the lateral visibility of the display apparatus. In an embodiment, the second color filter layer 820 and/or the third color filter layer 830 may include scattering particles.

A second substrate 900 may be located on the color filter layer 800. The second substrate 900 may include glass or a transparent organic material. For example, the second substrate 900 may include a transparent organic material such as acryl-based resin.

In an embodiment, after the color filter layer 800 and the color conversion-transparent layer 600 are sequentially formed on the second substrate 900, the first substrate 100 and the second substrate 900 may be bonded to each other so that the color conversion-transparent layer 600 may be located between the first substrate 100 and the second substrate 900.

In an embodiment, after the color conversion-transparent layer 600 and the color filter layer 800 are sequentially formed on the first substrate 100, the second substrate 900 may also be applied onto the color filter layer 800 and cured.

Figure 4:
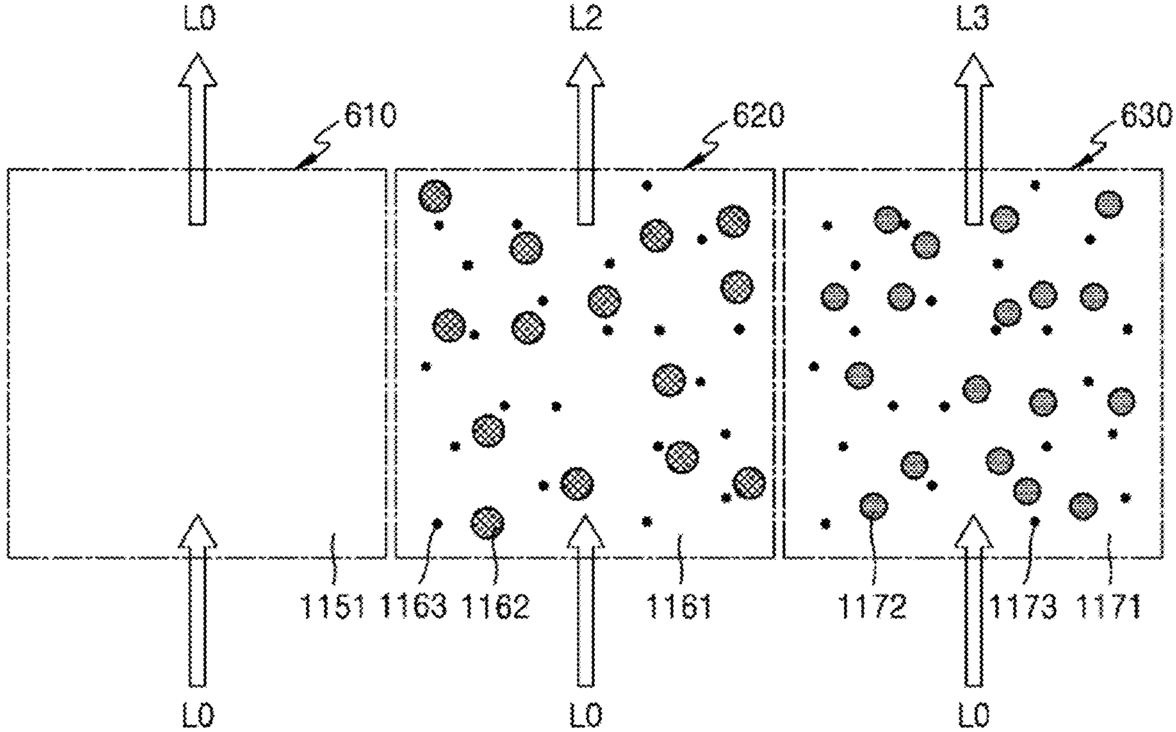
FIG. 4 illustrates optical portions of a color conversion-transparent layer according to an embodiment.

FIG. 4 illustrates optical portions of a color conversion-transparent layer according to an embodiment. FIG. 4 are diagrams for describing the color conversion-transparent layer 600 of the display apparatus shown in FIG. 3.

Referring to FIG. 4, the organic material layer 610 may include a transparent layer that passes through the first light L0 incident on the organic material layer 610 without conversion. The organic material layer 610 may include a first base resin 1151.

The first base resin 1151 included in the organic material layer 610 may be a transparent material. For example, the first base resin 1151 may include an acryl-based resin, an epoxy-based resin, benzocyclobutene (BCB), hexamethyldisiloxane (HMDSO), or a combination thereof.

The organic material layer 610 may not include scattering particles or quantum dots. In other words, there may be almost no optical interface for scattering light inside the organic material layer 610. Thus, the first light L0 incident on the organic material layer 610 may not be scattered or refracted by the scattering particles and/or the quantum dots but may pass through the organic material layer 610 along a path that is substantially a linear line.

The first color conversion layer 620 may be provided as a color conversion layer for converting light having a wavelength belonging to a first wavelength band of the first light L0 into the third light L2 having a wavelength belonging to a second wavelength band. Here, the second wavelength band may be, for example, about 625 nm to about 780 nm. Of course, embodiments are not limited thereto, and a wavelength band to which a wavelength belongs, to be converted by the first color conversion layer 620 and a wavelength band to which a wavelength belongs, after conversion may be modified unlike this.

The first color conversion layer 620 may include a second base resin 1161, first quantum dots 1162, and first scattering particles 1163, which are dispersed into the second base resin 1161.

In the specification, the quantum dots refer to crystals of a semiconductor compound, and may include any material capable of emitting light of various light-emitting wavelengths according to the size of the crystal. The diameter of the quantum dots may be, for example, about 1 nm to about 10 nm.

The quantum dots may be synthesized by a wet chemical process, an organic metal chemical vapor deposition process, a molecular beam epitaxy process, or a similar process. The wet chemical process is a method of growing quantum dot particle crystals after mixing an organic solvent and a precursor material. In case that the crystal is grown in the wet chemical process, the organic solvent serves as a dispersing agent coordinated on the surface of the quantum dot crystal and controls the growth of the crystal, so that it is easier to perform a vapor deposition method such as metal organic chemical vapor deposition (MOCVD) or molecular beam epitaxy (MBE). In the case of a wet chemical process, the growth of the quantum dot particles may be controlled while having a low cost.

The quantum dots may include a Group II-VI semiconductor compound, a Group III-V semiconductor compound, a Group III-VI semiconductor compound, a Group I-III-VI semiconductor compound, a Group IV-VI semiconductor compound, a Group IV element or a compound, or any combination thereof.

Examples of Group II-VI semiconductor compounds may include a binary element compound such as CdS, CdSe, CdTe, ZnS, ZnSe, ZnTe, ZnO, HgS, HgSe, HgTe, MgSe or MgS, a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe or MgZnS, a quaternary element compound such as CdZnSeS, CdZnSeTe, CdZnSTe, CdHgSeS, CdHgSeTe, CdHgSTe, HgZnSeS. HgZnSeTe or HgZnSTe, or any combination thereof.

Examples of Group III-V semiconductor compounds may include a binary element compound such as GaN, GaP, GaAs, GaSb, AlN, AlP, AlAs, AlSb, InN, InP, InAs or InSb, a ternary element compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb or GaAlNP, a quaternary element compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or any combination thereof. The Group III-V semiconductor compound may further include a Group II element. Examples of Group III-V semiconductor compounds that further include Group II elements may include InZnP, InGaZnP or InAlZnP.

Examples of Group III-VI semiconductor compounds may include a binary element compound such as GaS, GaSe, $Ga_2Se_3$, GaTe, InS, $In_2S_3$, InSe, $In_2Se_3$ or InTe, a ternary element compound such as AgInS, $AgInS_2$, CuInS, $CuInS_2$, $InGaS_3$ or $InGaSe_3$, or any combination thereof.

Examples of Group I-III-VI semiconductor compounds may include a ternary element compound such as AgInS, $AgInS_2$, CuInS, $CuInS_2$, $CuGaO_2$, $AgGaO_2$ or $AgAlO_2$, or any combination thereof.

Examples of Group IV-VI semiconductor compounds may include a binary element compound such as SnS, SnSe, SnTe, PbS, PbSe or PbTe, a ternary element compound such as SnSeS, SnSeTe, SnSTe, PbSeS, PbSeTe, PbSTe, SnPbS, SnPbSe or SnPbTe, a quaternary element compound such as SnPbSSe, SnPbSeTe or SnPbSTe, or any combination thereof.

The Group IV element or compound may include a single element such as Si or Ge or the like, a binary element compound such as SiC or SiGe, or any combination thereof.

Each element included in a polyelemental compound, such as a binary element compound, a ternary element compound, and a quaternary element compound, may be present in particles at a uniform concentration or a non-uniform concentration.

The quantum dots may have a single structure in which the concentration of each element included in the corresponding quantum dots is uniform or a dual structure of the core-shell. For example, the material included in a core and the material included in a shell may be different from each other. The shell of the quantum dots may serve as a protective layer for maintaining semiconductor characteristics by preventing chemical denaturation of the core and/or a charging layer for providing electrophoretic properties to the quantum dots. The shell may be a single layer or a multiple layer. The interface between the core and the shell may have a concentration gradient in which the concentration of elements present in the shell gradually decreases.

Examples of the shell of the quantum dots may include an oxide of a metal or a non-metal, a semiconductor compound, or a combination thereof. Examples of metal or non-metal oxides may include a binary element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ or NiO, a ternery element compound such as $MgAl_2O_4$, $CoFe_2O_4$, $NiFe_2O_4$ or $CoMn_2O_4$, or any combination thereof. Examples of semiconductor compounds may include a Group II-VI semiconductor compound, a Group III-V semiconductor compound, a Group III-VI semiconductor compound, a Group I-III-VI semiconductor compound, a Group IV-VI semiconductor compound, a Group IV element or a compound, or any combination thereof, as described above. For example, the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dots may have a full width of half maximum (FWHM) of an emission wavelength spectrum of about 45 nm or less, by way of example, about 40 nm or less, and more by way of example about 30 nm or less, and color purity or color reproducibility may be improved in this range. The light emitted through the quantum dots is emitted in all directions, thereby improving a wide viewing angle.

The shape of the quantum dots may be, for example, in the form of a spherical, pyramidal, multi-arm, or cubic, nanoparticle, nanotube, nanowire, nanofiber, or nanoplate particle.

Since the energy band gap may be adjusted by adjusting the size of the quantum dots, light of various wavelength bands may be obtained in the quantum dot emission layer. Thus, by using quantum dots having different sizes, a light-emitting element that emits light having several wavelengths may be implemented.

The first quantum dots 1162 may be excited by the first light L0 and may emit the third light L2 having a wavelength belonging to a second wavelength band. The second base resin 1161 may include an acryl-based resin, an epoxy-based resin, BCB, HMDSO, or a combination thereof. The first scattering particles 1163 may scatter the first light L0 that is not absorbed by the first quantum dots 1162 so that more first quantum dots 1162 are excited, thereby increasing color conversion efficiency. The first scattering particles 1163 may be metal oxide particles such as titanium oxide ($TiO_2$) or organic particles.

The second color conversion layer 630 may be provided as a color conversion layer for converting light having a wavelength belonging to a first wavelength band of the first light L0 into the fourth light L3 having a wavelength belonging to a third wavelength band. Here, the third wavelength band may be, for example, about 495 nm to about 570 nm. Of course, embodiments are not limited thereto, and a wavelength band to which a wavelength belongs, to be converted by the second color conversion layer 630 and a wavelength band to which a wavelength belongs, after conversion may be converted unlike this.

The second color conversion layer 630 may include a third base resin 1171, second quantum dots 1172, and second scattering particles 1173, which are dispersed into the third base resin 1171.

The second quantum dots 1172 may be excited by the first light L0 and may emit the third light L2 having a wavelength belonging to a third wavelength band. The third base resin 1171 may include an acryl-based resin, an epoxy-based resin, BCB, HMDSO, or a combination thereof. The second scattering particles 1173 may scatter the first light L0 that is not absorbed by the second quantum dots 1172 so that more second quantum dots 1172 are excited, thereby increasing color conversion efficiency. The second scattering particles 1173 may be metal oxide particles such as titanium oxide ($TiO_2$) or organic particles.

In an embodiment, the first quantum dots 1162 and the second quantum dots 1172 may include a same material or a similar material. The sizes of the first quantum dots 1162 may be greater than the sizes of the second quantum dots 1172.

In an embodiment, the organic material layer 610 and the second color conversion layer 630 may be provided as transparent layers for passing the first light L0 incident on the organic material layer 610 and the second color conversion layer 630, respectively, without conversion. As described above, in an embodiment, the first light L0 may be a mixed light of pieces of light having a wavelength belonging to different wavelength bands. The second color conversion layer 630 may include a third base resin 1171 in which the second scattering particles 1173 are dispersed.

The third color filter layer (see 830 of FIG. 3) may pass through only the fourth light L3 having a wavelength belonging to about 495 nm to about 570 nm of the first light L0 that passes through the second color conversion layer 630.

In an embodiment, the organic material layer 610, the first color conversion layer 620, and the second color conversion layer 630 may be provided as transparent layers for passing the first light L0 incident on the organic material layer 610, the first color conversion layer 620, and the second color conversion layer 630, respectively, without conversion. The first color conversion layer 620 may include a second base resin 1161 in which first scattering particles 1163 are dispersed, and the second color conversion layer 630 may include the third base resin 1171 in which the second scattering particles 1173 are dispersed. The first color conversion layer 620 may not include the first quantum dots 1162, and the second color conversion layer 630 may not include the second quantum dots 1172.

The second color filter layer (see 820 of FIG. 3) may pass through only the third light L2 having a wavelength belonging to about 625 nm to about 780 nm of the first light L0 that transmits through the first color conversion layer 620, and the third color filter layer (see 830 of FIG. 3) may pass through only the fourth light L3 having a wavelength belonging to about 495 nm to about 570 nm of the first light L0 that transmits through the second color conversion layer 630.

In an embodiment, the organic material layer 610 may also be omitted.

Figure 5:
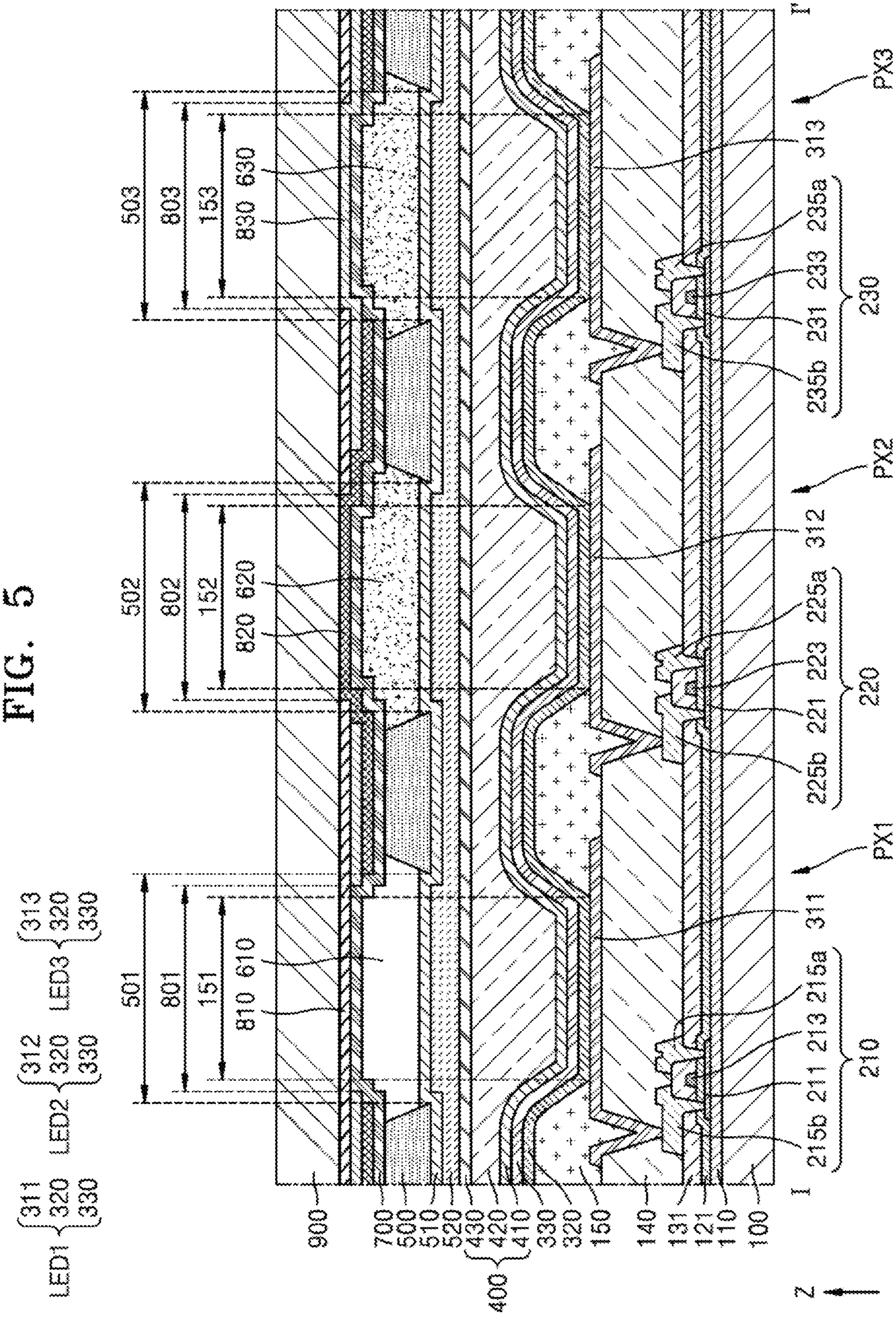
FIG. 5 is a schematic cross-sectional view schematically illustrating a display apparatus according to an embodiment.

FIG. 5 is a schematic cross-sectional view schematically illustrating a display apparatus according to an embodiment. FIG. 5 is a schematic cross-sectional view schematically illustrating a cross-section of the display apparatus of FIG. 2A taken along line I-I'.

Referring to FIG. 5, the display apparatus according to an embodiment may include a first substrate 100, a first pixel electrode 311, a second pixel electrode 312, a third pixel electrode 313, a pixel-defining layer 150, an encapsulation layer 400, a second substrate 900, a bank 500, an organic material layer 610, a first color conversion layer 620, and a second color conversion layer 630.

The first substrate 100 may include glass, metal or polymer resin. The first substrate 100 may include a polymer resin such as polyethersulphone, polyacrylate, polyetherimide, polyethylene naphthalate, polyethylene terephthalate, polyphenylene sulfide, polyarylate, polyimide, polycarbonate or cellulose acetate propionate. Of course, the first substrate 100 may have a multi-layered structure including two layers including the polymer resin and a barrier layer including an inorganic material (such as silicon oxide, silicon nitride, silicon oxynitride, etc.) between the two layers.

The first pixel electrode 311, the second pixel electrode 312, and the third pixel electrode 313 may be located on the first substrate 100. Of course, in addition to the first pixel electrode 311, the second pixel electrode 312, and the third pixel electrode 313, a first thin film transistor 210, a second thin film transistor 220, and a third thin film transistor 230 electrically connected to the first pixel electrode 311, the second pixel electrode 312, and the third pixel electrode 313 respectively may be disposed on the first substrate 100. In other words, as shown in FIG. 5, the first pixel electrode 311 may be electrically connected to the first thin film transistor 210, and the second pixel electrode 312 may be electrically connected to the second thin film transistor 220, and the third pixel electrode 313 may be electrically connected to the third thin film transistor 230. The first pixel electrode 311, the second pixel electrode 312, and the third pixel electrode 313 may be disposed on a planarization layer 140 to be described below on the first substrate 100.

The first thin film transistor 210 may include a first semiconductor layer 211 including amorphous silicon, polycrystalline silicon, an organic semiconductor material or an oxide semiconductor material, a first gate electrode 213, a first source electrode 215*a*, and a first drain electrode 215*b*. The first gate electrode 213 may include conductive materials and may have layered structures, for example, a Mo layer and an Al layer. The first gate electrode 213 may have a layered structure of Mo/Al/Mo. By way of example, the first gate electrode 213 may also include a TiNx layer, an Al layer and/or a Ti layer. The first source electrode 215*a* and the first drain electrode 215*b* may include other conductive materials and may have other layered structures, for example, a Ti layer, an Al layer and/or a Cu layer. The first source electrode 215*a* and the first drain electrode 215*b* may have a layered structure of Ti/Al/Ti.

FIG. 5 illustrates that the first thin film transistor 210 may include both the first source electrode 215*a* and the first drain electrode 215*b*, but embodiments are not limited thereto. For example, a source region of the first semiconductor layer 211 of the first thin film transistor 210 may be integral with the drain region of a semiconductor layer of another thin film transistor, and the first thin film transistor 210 may not have the first source electrode 215*a*. The first source electrode 215*a* and/or the first drain electrode 215*b* may be a portion of a wiring.

In order to secure insulating properties between the first semiconductor layer 211 and the first gate electrode 213, a gate insulating layer 121 including an inorganic material such as silicon oxide, silicon nitride, and/or silicon oxynitride may be between the first semiconductor layer 211 and the first gate electrode 213. Furthermore, an interlayer insulating layer 131 including an inorganic material such as silicon oxide, silicon nitride and/or silicon oxynitride may be disposed above the first gate electrode 213, and the first source electrode 215*a* and the first drain electrode 215*b* may be arranged on the interlayer insulating layer 131. In this way, an insulating layer including the inorganic material may be formed through chemical vapor deposition (CVD) or atomic layer deposition (ALD). This is also applied to the following embodiments and variations thereof.

A buffer layer 110 including an inorganic material such as silicon oxide, silicon nitride, and/or silicon oxynitride may be between the first thin film transistor 210 and the first substrate 100 having such a structure. The buffer layer 110 may increase the smoothness of the upper surface of the first substrate 100 and prevent or minimize impurities from the first substrate 100 from penetrating into the first semiconductor layer 211 of the first thin film transistor 210.

The second thin film transistor 220 located at the second pixel PX2 may include a second semiconductor layer 221, a second gate electrode 223, a second source electrode 225*a*, and a second drain electrode 225*b*. The third thin film transistor 230 located at the third pixel PX3 may include a third semiconductor layer 231, a third gate electrode 233, a third source electrode 235*a*, and a third drain electrode 235*b*. Because the structure of the second thin film transistor 220 and the structure of the third thin film transistor 230 are the same as or similar to the structure of the first thin film transistor 210 positioned in the first pixel PX1, a description thereof may be omitted.

The planarization layer 140 may be disposed on the first thin film transistor 210. For example, as shown in FIG. 5, in case that the first light emitting device LED1 including the first pixel electrode 311 is disposed above the first thin film transistor 210, the planarization layer 140 for covering the first thin film transistor 210 may have approximately a flat upper surface so that the first pixel electrode 311 of the first light emitting device LED1 may be located on the flat surface. The planarization layer 140 may include an organic material, for example, acryl-based resin, BCB or HMDSO. In FIG. 5, the planarization layer 140 is shown as a single layer, but there may be various modifications such as a multi-layered structure.

The first light emitting device LED1 having the first pixel electrode 311, the opposite electrode 330, and the intermediate layer 320 between the first pixel electrode 311 and the opposite electrode 330 and including an emission layer may be located at the first pixel PX1. The first pixel electrode 311 may come into contact with one of the first source electrode 215*a* and the first drain electrode 215*b* through a contact hole formed in the planarization layer 140, as shown in FIG. 5, and may be electrically connected to the first thin film transistor 210. The first pixel electrode 311 may include a transparent conductive layer formed of a transparent conductive oxide such as ITO, $In_2O_3$ or IZO, and a reflective layer formed of metal such as Al or Ag. For example, the first pixel electrode 311 may have a three-layer structure of ITO/Ag/ITO.

The second light emitting device LED2 having the second pixel electrode 312, the opposite electrode 330, and the intermediate layer 320 between the first pixel electrode 311 and the opposite electrode 330 and including an emission layer may be located at the second pixel PX2. The third light emitting device LED3 having the third pixel electrode 313, the opposite electrode 330, and the intermediate layer 320 between the first pixel electrode 311 and the opposite electrode 330 and including an emission layer may be located at the third pixel PX3. The second pixel electrode 312 may come into contact with one of a second source electrode 225*a* and a second drain electrode 225*b* through the contact hole formed in the planarization layer 140 and may be electrically connected to the second thin film transistor 220. The third pixel electrode 313 may come into contact with one of a third source electrode 235*a* and a third drain electrode 235*b* through the contact hole formed in the planarization layer 140 and may be electrically connected to the third thin film transistor 230. A description of the first pixel electrode 311 described above may be applied to the second pixel electrode 312 and the third pixel electrode 313.

The intermediate layer 320 may be located on the second pixel electrode 312 of the second pixel PX2 and the third pixel electrode 313 of the third pixel PX3 in addition to the first pixel electrode 311 of the first pixel PX1. The intermediate layer 320 may be integrally formed across the first pixel electrode 311, the second pixel electrode 312, and the third pixel electrode 313. As necessary, the intermediate layer 320 may be patterned on the first pixel electrode 311, the second pixel electrode 312, and the third pixel electrode 313. The intermediate layer 320 may include at least one emission unit. A more detailed description of the intermediate layer 320 is provided below.

The opposite electrode 330 on the intermediate layer 320 may also be integrally formed across the first pixel electrode 311, the second pixel electrode 312, and the third pixel electrode 313. The opposite electrode 330 may include a transparent conductive layer formed of ITO, $In_2O_3$ or IZO, and may also include a semi-transmitting layer including metal such as Al, lithium (Li), magnesium (Mg), ytterbium (Yb) or Ag. The opposite electrode 330 may be a semi-transmitting layer including MgAg, AgYb, Yb/MgAg or Li/MgAg.

The pixel-defining layer 150 may be disposed above the planarization layer 140. The pixel-defining layer 150 may have pixel openings corresponding to pixels PX. In other words, the pixel-defining layer 150 may cover edges of each of the first pixel electrode 311, the second pixel electrode 312, and the third pixel electrode 313, and may have a first pixel opening 151 for exposing the center of the first pixel electrode 311, a second pixel opening 152 for exposing the center of the second pixel electrode 312, and a third pixel opening 153 for exposing the center of the third pixel electrode 313. As shown in FIG. 5, the pixel-defining layer 150 may increase a distance between edges of each of the first pixel electrode 311, the second pixel electrode 312 and the third pixel electrode 313 and the opposite electrode 330, thereby preventing an arc or the like from occurring in edges of the first pixel electrode 311, the second pixel electrode 312, and the third pixel electrode 313. The pixel-defining layer 150 may include an organic material such as polyimide or HMDSO, for example.

Light emitting devices LED1, LED2, and LED3 including the first pixel electrode 311, the second pixel electrode 312, the third pixel electrode 313, the intermediate layer 320 including an emission layer, and the opposite electrode 330 may be deteriorated by moisture, oxygen, or the like within the spirit and the scope of the disclosure. Thus, in order to protect the light emitting devices LED1, LED2 and LED3 from moisture, oxygen, or the like from the outside, the display apparatus may include the encapsulation layer 400 for covering organic light emitting devices.

The encapsulation layer 400 may include at least one inorganic encapsulation layer and at least one organic encapsulation layer. For example, the encapsulation layer 400 may include a first inorganic encapsulation layer 410, a second inorganic encapsulation layer 430, and an organic encapsulation layer 420 therebetween.

The first inorganic encapsulation layer 410 and the second inorganic encapsulation layer 430 may include one or more inorganic insulating materials such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$) or zinc oxide ($ZnO_2$), and may be formed through CVD or the like within the spirit and the scope of the disclosure. The organic encapsulation layer 420 may include a polymer-based material. The polymer-based material may include silicon-based resin, acryl-based resin (for example, polymethylmethacrylate, polyacrylic acid or the like), epoxy-based resin, polyimide, and polyethylene.

Since the first inorganic encapsulation layer 410 formed by CVD has a substantially uniform thickness, the upper surface of the first inorganic encapsulation layer 410 is not flat, as shown in FIG. 5. However, the organic encapsulation layer 420 may have a shape in which an upper surface thereof is approximatly flat. Thus, the upper surface of the second inorganic encapsulation layer 430 on the organic encapsulation layer 420 may also be approximately flat.

The second substrate 900 may be located above the first substrate 100 so that the opposite electrode 330 is located between the first substrate 100 and the second substrate 900. The second substrate 900 may include glass, metal or polymer resin. The second substrate 900 may include a polymer resin such as polyethersulphone, polyacrylate, polyetherimide, polyethylene naphthalate, polyethylene terephthalate, polyphenylene sulfide, polyarylate, polyimide, polycarbonate or cellulose acetate propionate. Of course, the second substrate 900 may have a multi-layered structure including two layers including the polymer resin and a barrier layer including an inorganic material (such as silicon oxide, silicon nitride, silicon oxynitride, etc.) between the two layers.

The bank 500 may be located on a lower surface of the second substrate 900 in a direction (−z-direction) of the first substrate 100. The bank 500 may have a first bank opening 501, a second bank opening 502, and a third bank opening 503. The bank openings of the bank 500 may correspond to light emitting devices. In detail, the first bank opening 501 of the bank 500 may correspond to the first pixel opening 151 for exposing the first pixel electrode 311 of the pixel-defining layer 150, the second bank opening 502 of the bank 500 may correspond to the second pixel opening 152 for exposing the second pixel electrode 312 of the pixel-defining layer 150, and the third bank opening 503 of the bank 500 may correspond to the third pixel opening 153 for exposing the third pixel electrode 313 of the pixel-defining layer 150.

For example, in case that viewed from a direction (z-axis direction) perpendicular to the first substrate 100, the first bank opening 501 of the bank 500 may overlap the first pixel opening 151 for exposing the first pixel electrode 311 of the pixel-defining layer 150, the second bank opening 502 of the bank 500 may overlap the second pixel opening 152 for exposing the second pixel electrode 312 of the pixel-defining layer 150, and the third bank opening 503 of the bank 500 may overlap the third pixel opening 153 for exposing the third pixel electrode 313 of the pixel-defining layer 150. Thus, in case that viewed from the direction (z-axis direction) perpendicular to the first substrate 100, the shape of edges of each of the first bank opening 501 to the third bank opening 503 of the bank 500 may be the same as or similar to the shape of edges of a pixel opening corresponding to the pixel-defining layer 150. In this way, the first bank opening 501 of the bank 500 may correspond to the first pixel electrode 311, the second bank opening 502 of the bank 500 may correspond to the second pixel electrode 312, and the third bank opening 503 of the bank 500 may correspond to the third pixel electrode 313.

The bank 500 may be formed of various materials, for example, an organic material such as BCB or HMDSO. If necessary, the bank 500 may include a photoresist material, thereby readily forming the bank 500 through exposure and development processes. In a manufacturing process, a bank 500 may be formed on the second substrate 900, and an organic material layer 610, a first color conversion layer 620, a second color conversion layer 630, and the like, as described below, may be formed in the bank openings of the bank 500, and the first substrate 100 and the second substrate 900 are bonded to each other by using a bonding member or the like within the spirit and the scope of the disclosure. In an embodiment, as shown in FIG. 5, in a schematic cross-sectional view, the bank 500 may have an inversely tapered shape centered on the second substrate 900.

An organic material layer 610 may be located in the first bank opening 501 of the bank 500 overlapping the first pixel electrode 311. The organic material layer 610 may be provided as a transparent layer for passing light emitted by the first light emitting device LED1 without color conversion. The organic material layer 610 may include a first base resin 1151. The material for forming the organic material layer 610 may be located in the first bank opening 501 of the bank 500 overlapping the first pixel electrode 311 through an inkjet printing method. The organic material layer 610 may not include scattering particles or quantum dots. Thus, the first light L0 incident on the organic material layer 610 may not be scattered or refracted by the scattering particles and/or the quantum dots but may pass through the organic material layer 610 along a path that is substantially a linear line.

In an embodiment, the refractive index of the organic material layer 610 may be similar to or substantially the same as the refractive index of the organic encapsulation layer 420.

The first color conversion layer 620 may be located in the second bank opening 502 of the bank 500 overlapping the second pixel electrode 312. As described with reference to FIG. 4, in an embodiment, the first color conversion layer 620 may be provided as a color conversion layer for converting at least a portion of emitted light emitted by the second light emitting device LED2 into light having a wavelength belonging to a second wavelength band. The second wavelength band may be, for example, about 625 nm to about 780 nm. The first color conversion layer 620 may include a second base resin 1161, a first scattering particle 1163, and a first quantum dot 1162.

In an embodiment, the first color conversion layer 620 may be provided as a transparent layer for passing light emitted by the second light emitting device LED2 without color conversion. For example, the first color conversion layer 620 may include a second base resin 1161 and a first scattering particle 1163 but may not include the first quantum dot 1162. The material for forming the first color conversion layer 620 may be located in the second bank opening 502 of the bank 500 overlapping the second pixel electrode 312 through an inkjet printing method.

The second color conversion layer 630 may be located in the third bank opening 503 of the bank 500 overlapping the third pixel electrode 313. As described with reference to FIG. 4, in an embodiment, the second color conversion layer 630 may be provided as a color conversion layer for converting at least a portion of emitted light emitted by the third light emitting device LED3 into light having a wavelength belonging to a third wavelength band. The third wavelength band may be, for example, about 495 nm to about 570 nm. For example, the second color conversion layer 630 may include a third base resin 1171, a second scattering particle 1173, and a second quantum dot 1172.

In an embodiment, the second color conversion layer 630 may be provided as a transparent layer for passing light emitted by the third light emitting device LED3 without color conversion. For example, the second color conversion layer 630 may include a third base resin 1171 and a second scattering particle 1173 but may not include the second quantum dot 1172. The material for forming the second color conversion layer 630 may be located in the third bank opening 503 of the bank 500 overlapping the third pixel electrode 313 through an inkjet printing method.

A surface of the bank 500 in a direction (−z-direction) of the first substrate 100, a surface of the organic material layer 610 in the direction (−z-direction) of the first substrate 100, a surface of the first color conversion layer 620 in the direction (−z-direction) of the first substrate 100, and a surface of the second color conversion layer 630 in the direction (−z-direction) of the first substrate 100 may be covered with the protection layer 510. The protection layer 510 may protect the organic material layer 610, the first color conversion layer 620, and the second color conversion layer 630. The protection layer 510 may include an inorganic material such as silicon nitride, silicon oxide, or silicon oxynitride.

A color filter layer may be disposed between the organic material layer 610, the first color conversion layer 620, and the second color conversion layer 630 and the second substrate 900. A first color filter layer 810 is disposed above the organic material layer 610, a second color filter layer 820 is disposed above the first color conversion layer 620, and a third color filter layer 830 is disposed above the second color conversion layer 630.

The first color filter layer 810 may be a layer for passing only first light (see L1 of FIG. 3) having a wavelength belonging to about 450 nm to about 495 nm. The second color filter layer 820 may be a layer for passing only second light (see L2 of FIG. 3) having a wavelength belonging to about 625 nm to about 780 nm. The third color filter layer 830 may be a layer for passing only third light (see L3 of FIG. 3) having a wavelength belonging to about 495 nm to about 570 nm. In an embodiment, the first color filter layer 810 may include scattering particles. In an embodiment, the first color filter layer 810, the second color filter layer 820, and the third color filter layer 830 may include scattering particles.

The first color filter layer 810, the second color filter layer 820, and the third color filter layer 830 may increase the color purity of light emitted to the outside, thereby increasing the quality of the displayed image. The first color filter layer 810, the second color filter layer 820, and the third color filter layer 830 may reduce a ratio in which external light incident on the display apparatus from the outside is reflected from the first pixel electrode 311, the second pixel electrode 312 and the third pixel electrode 313 and is emitted to the outside again, thereby reducing external light reflection. A black matrix may be located between the first color filter layer 810, the second color filter layer 820 and the third color filter layer 830 if necessary.

The first color filter layer 810 may have a second filter opening 802 corresponding to the first color conversion layer 620, as shown in FIG. 5. The second filter opening 802 of the first color filter layer 810 may serve to define the region of the second pixel PX2. For example, the shape and size of the second pixel PX2 in case that viewed from a direction perpendicular to the first substrate 100, may be defined by the second filter opening 802 of the first color filter layer 810. The second color filter layer 820 may fill the second filter opening 802 of the first color filter layer 810.

The first color filter layer 810 may have a third filter opening 803 corresponding to the second color conversion layer 630, as shown in FIG. 5. The third filter opening 803 of the first color filter layer 810 may serve to define the region of the third pixel PX3. For example, the shape and size of the third pixel PX3 in case that viewed from a direction perpendicular to the first substrate 100, may be defined by the third filter opening 803 of the first color filter layer 810. The third color filter layer 830 may fill at least the third filter opening 803 of the first color filter layer 810.

The third color filter layer 830 may have the first filter opening 801 corresponding to the organic material layer 610. The first filter opening 801 of the third color filter layer 830 may serve to define the region of the first pixel PX1. For example, the shape and size of the first pixel PX1 in case that viewed from a direction perpendicular to the first substrate 100, may be defined by the first filter opening 801 of the third color filter layer 830. The first color filter layer 810 may fill at least the first filter opening 801 of the third color filter layer 830.

In this way, because the first color filter layer 810 defines the region of the second pixel PX2 and the region of the third pixel PX3 through the second filter opening 802 and the third filter opening 803, the first color filter layer 810 may be a filter defining layer in the second pixel PX2 and the third pixel PX3. Similarly, the third color filter layer 830 may define a region of the first pixel PX1 through the first filter opening 801, and the third color filter layer 830 may be referred to as a filter definition layer in the first pixel PX1. Of course, the filter definition layer may be referred to as a pixel region definition layer.

A portion where the two or more color filter layers overlap may serve as a black matrix. For example, if the first color filter layer 810 passes through only light having a wavelength of about 450 nm to about 495 nm, and the second color filter layer 820 passes through only light having a wavelength of about 625 nm to about 780 nm, light that may pass through both the first color filter layer 810 and the second color filter layer 820 is not theoretically present in the overlapping portion of the first color filter layer 810 and the second color filter layer 820. Of course, a portion of the first color filter layer 810, the second color filter layer 820, and the third color filter layer 830 overlap each other between the first pixel PX1, the second pixel PX2, and the third pixel PX3, and thus the color filters may serve as a black matrix between the first pixel PX1, the second pixel PX2, and the third pixel PX3.

In an embodiment, a low refractive index layer 700 may be located between the first color filter layer 810, the second color filter layer 820 and the third color filter layer 830, and the bank 500, the organic material layer 610, the first color conversion layer 620, and the second color conversion layer 630. In the manufacturing process, the low refractive index layer 700 may cover the first color filter layer 810, the second color filter layer 820, and the third color filter layer 830, and the bank 500 and the like may be formed on the upper surface thereof. The low refractive index layer 700 may include an inorganic material such as silicon oxide, silicon nitride, silicon oxynitride and may be formed through a CVD method.

The first substrate 100 and the second substrate 900 may be bonded to each other by a bonding member such as a sealant outside the display area DA. Here, a filling material 520 may be filled between a laminate on the first substrate 100 and a laminate on the second substrate 900 as necessary. For example, the filling material 520 may be filled between the encapsulation layer 400 and the protection layer 510. The filling material 520 may include resin such as acryl or epoxy.

Figure 6:
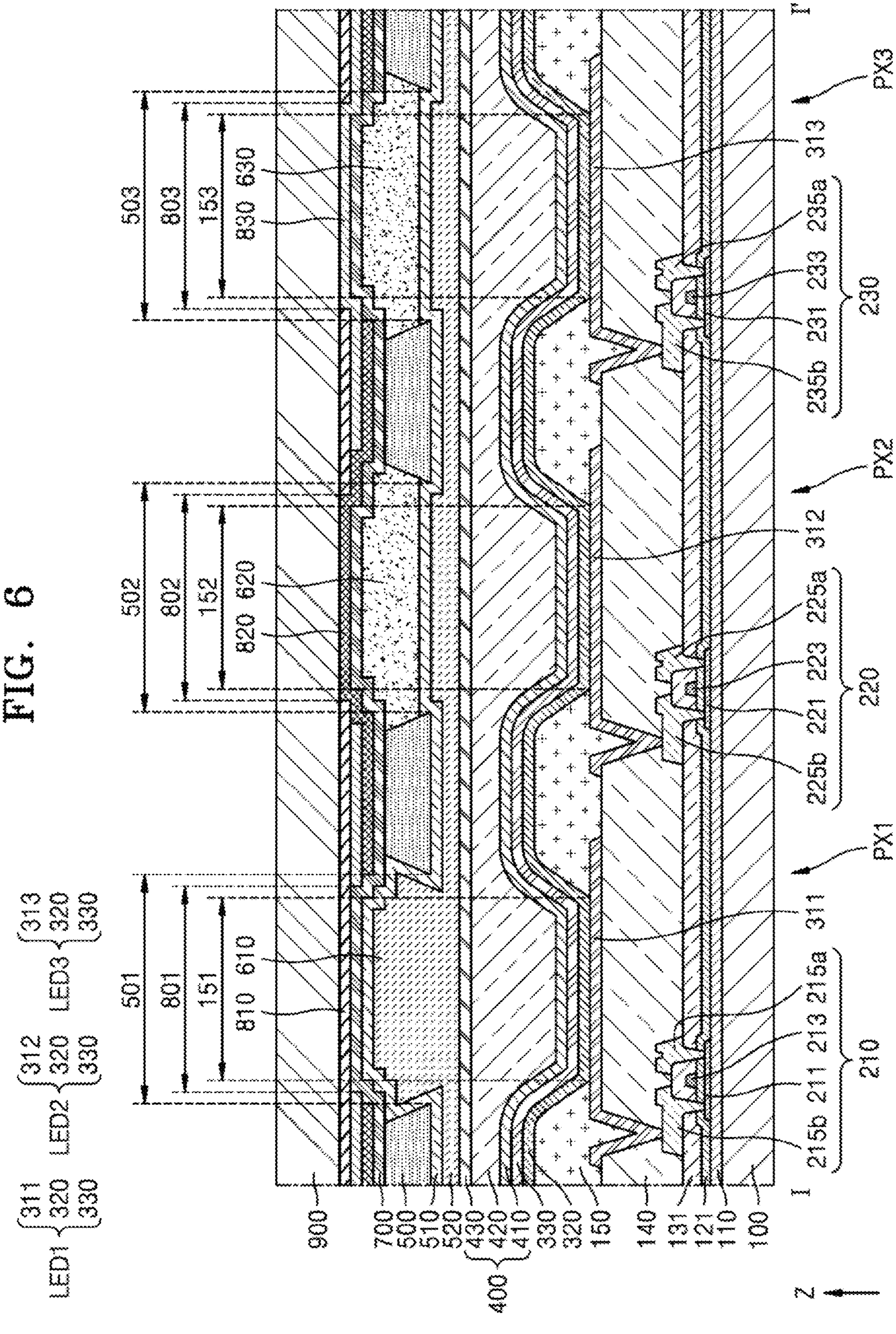
FIG. 6 is a schematic cross-sectional view schematically illustrating a display apparatus according to an embodiment.

FIG. 6 is a schematic cross-sectional view schematically illustrating a display apparatus according to an embodiment. FIG. 6 is similar to FIG. 5, but there is difference between FIGS. 6 and 5 in that the organic material layer 610 is integral with the filling material 520. Hereinafter, descriptions of the same or similar components may be omitted, and differences will be described.

Referring to FIG. 6, the display apparatus according to an embodiment may include a first substrate 100, a first pixel electrode 311, a second pixel electrode 312, a third pixel electrode 313, a pixel-defining layer 150, an encapsulation layer 400, a second substrate 900, a bank 500, an organic material layer 610, a first color conversion layer 620, and a second color conversion layer 630.

The first pixel electrode 311, the second pixel electrode 312, and the third pixel electrode 313 may be located on the first substrate 100. Of course, in addition to the first pixel electrode 311, the second pixel electrode 312, and the third pixel electrode 313, a first thin film transistor 210, a second thin film transistor 220, and a third thin film transistor 230 electrically connected to the first pixel electrode 311, the second pixel electrode 312, and the third pixel electrode 313 may be disposed on the first substrate 100.

The planarization layer 140 may be disposed on the first thin film transistor 210. The first light emitting device LED1 having the first pixel electrode 311, the opposite electrode 330, and the intermediate layer 320 between the first pixel electrode 311 and the opposite electrode 330 and including an emission layer may be located at the first pixel PX1. The first pixel electrode 311 may come into contact with one of the first source electrode 215*a* and the first drain electrode 215*b* through a contact hole formed in the planarization layer 140, as shown in FIG. 6, and may be electrically connected to the first thin film transistor 210.

The second light emitting device LED2 having the second pixel electrode 312, the opposite electrode 330, and the intermediate layer 320 between the first pixel electrode 311 and the opposite electrode 330 and including an emission layer may be located at the second pixel PX2. The third light emitting device LED3 having the third pixel electrode 313, the opposite electrode 330, and the intermediate layer 320 between the first pixel electrode 311 and the opposite electrode 330 and including an emission layer may be located at the third pixel PX3. The second pixel electrode 312 may come into contact with one of a second source electrode 225*a* and a second drain electrode 225*b* through the contact hole formed in the planarization layer 140 and may be electrically connected to the second thin film transistor 220. The third pixel electrode 313 may come into contact with one of a third source electrode 235*a* and a third drain electrode 235*b* through the contact hole formed in the planarization layer 140 and may be electrically connected to the third thin film transistor 230.

The intermediate layer 320 may be located on the second pixel electrode 312 of the second pixel PX2 and the third pixel electrode 313 of the third pixel PX3 in addition to the first pixel electrode 311 of the first pixel PX1. The intermediate layer 320 may be integrally formed across the first pixel electrode 311, the second pixel electrode 312, and the third pixel electrode 313. As necessary, the intermediate layer 320 may be patterned on the first pixel electrode 311, the second pixel electrode 312, and the third pixel electrode 313. The intermediate layer 320 may include at least one emission unit.

The opposite electrode 330 on the intermediate layer 320 may also be integrally formed across the first pixel electrode 311, the second pixel electrode 312, and the third pixel electrode 313.

A pixel-defining layer 150 may be disposed above the planarization layer 140. The pixel-defining layer 150 may have pixel openings corresponding to pixels PX. In other words, the pixel-defining layer 150 may cover edges of each of the first pixel electrode 311, the second pixel electrode 312, and the third pixel electrode 313, and may have a first pixel opening 151 for exposing the center of the first pixel electrode 311, a second pixel opening 152 for exposing the center of the second pixel electrode 312, and a third pixel opening 153 for exposing the center of the third pixel electrode 313.

The encapsulation layer 400 may include at least one inorganic encapsulation layer and at least one organic encapsulation layer. For example, the encapsulation layer 400 may include a first inorganic encapsulation layer 410, a second inorganic encapsulation layer 430, and an organic encapsulation layer 420 therebetween.

The second substrate 900 may be located above the first substrate 100 so that the opposite electrode 330 is located between the first substrate 100 and the second substrate 900.

The bank 500 may be located on a lower surface of the second substrate 900 in the direction (−z-direction) of the first substrate 100. The bank 500 may have a first bank opening 501, a second bank opening 502, and a third bank opening 503. The bank openings of the bank 500 may correspond to light emitting devices. In detail, the first bank opening 501 of the bank 500 may correspond to the first pixel opening 151 for exposing the first pixel electrode 311 of the pixel-defining layer 150, the second bank opening 502 of the bank 500 may correspond to the second pixel opening 152 for exposing the second pixel electrode 312 of the pixel-defining layer 150, and the third bank opening 503 of the bank 500 may correspond to the third pixel opening 153 for exposing the third pixel electrode 313 of the pixel-defining layer 150.

The first color conversion layer 620 may be located in the second bank opening 502 of the bank 500 overlapping the second pixel electrode 312. As described with reference to FIG. 4, in an embodiment, the first color conversion layer 620 may be provided as a color conversion layer for converting at least a portion of emitted light emitted by the second light emitting device LED2 into light having a wavelength belonging to a second wavelength band. The second wavelength band may be, for example, about 625 nm to about 780 nm. The first color conversion layer 620 may include a second base resin 1161, a first scattering particle 1163, and a first quantum dot 1162.

In an embodiment, the first color conversion layer 620 may be provided as a transparent layer for passing light emitted by the second light emitting device LED2 without color conversion. For example, the first color conversion layer 620 may include a second base resin 1161 and a first scattering particle 1163 but may not include the first quantum dot 1162. The material for forming the first color conversion layer 620 may be located in the second bank opening 502 of the bank 500 overlapping the second pixel electrode 312 through an inkjet printing method.

The second color conversion layer 630 may be located in the third bank opening 503 of the bank 500 overlapping the third pixel electrode 313. As described with reference to FIG. 4, in an embodiment, the second color conversion layer 630 may be provided as a color conversion layer for converting at least a portion of emitted light emitted by the third light emitting device LED3 into light having a wavelength belonging to a third wavelength band. The third wavelength band may be, for example, about 495 nm to about 570 nm. For example, the second color conversion layer 630 may include a third base resin 1171, a second scattering particle 1173, and a second quantum dot 1172.

In an embodiment, the second color conversion layer 630 may be provided as a transparent layer for passing light emitted by the third light emitting device LED3 without color conversion. For example, the second color conversion layer 630 may include a third base resin 1171 and a second scattering particle 1173 but may not include the second quantum dot 1172. The material for forming the second color conversion layer 630 may be located in the third bank opening 503 of the bank 500 overlapping the third pixel electrode 313 through an inkjet printing method.

A color filter layer may be disposed between the first color conversion layer 620, and the second color conversion layer 630 and the second substrate 900. A first color filter layer 810 may be disposed on the first pixel electrode 311, a second color filter layer 820 may be disposed on the second pixel electrode 312, and a third color filter layer 830 may be disposed on the third pixel electrode 313.

The first color filter layer 810 may be a layer for passing through only first light (see L1 of FIG. 3) having a wavelength belonging to about 450 nm to about 495 nm. The second color filter layer 820 may be a layer for passing through only second light (see L2 of FIG. 3) having a wavelength belonging to about 625 nm to about 780 nm. The third color filter layer 830 may be a layer for passing through only third light (see L3 of FIG. 3) having a wavelength belonging to about 495 nm to about 570 nm. In an embodiment, the first color filter layer 810 may include scattering particles. In an embodiment, the first color filter layer 810, the second color filter layer 820, and the third color filter layer 830 may include scattering particles.

A low refractive index layer 700 may be located between the first color filter layer 810, the second color filter layer 820 and the third color filter layer 830, and the bank 500, the first color conversion layer 620, and the second color conversion layer 630.

A surface of the bank 500 in a direction (−z-direction) of the first substrate 100, a surface of the first color conversion layer 620 in the direction (−z-direction) of the first substrate 100, and a surface of the second color conversion layer 630 in the direction (−z-direction) of the first substrate 100 may be covered with the protection layer 510. A surface of the low refractive index layer 700 in direction (−z-direction) of the first substrate 100 in the first bank opening 501 of the bank 500 overlapping the first pixel electrode 311 may be covered with a protection layer 510. For example, the protection layer 510 and the low refractive index layer 700 may be in direct contact with each other within the first bank opening 501 of the bank 500.

The first substrate 100 and the second substrate 900 may be bonded to each other by a bonding member such as a sealant outside the display area DA. Here, a filling material 520 may be filled between a laminate on the first substrate 100 and a laminate on the second substrate 900 as necessary. For example, the filling material 520 may be filled between the encapsulation layer 400 and the protection layer 510. The filling material 520 may bury the first bank opening 501 of the bank 500. In other words, the organic material layer 610 located in the first bank opening 501 of the bank 500 may be integral with the filling material 520. The organic material layer 610 may be a portion of the filling material 520. The filling material 520 may include resin such as acryl or epoxy.

The filling material 520 may not include scattering particles or quantum dots. In other words, there may be almost no optical interface for scattering light inside the filling material 520. Thus, the first light L0 incident on the filling material 520 may not be scattered or refracted by the scattering particles and/or the quantum dots but may pass through the filling material 520 along a path that is substantially a linear line.

In an embodiment, the refractive index of the filling material 520 may be similar to or substantially the same as the refractive index of the organic encapsulation layer 420.

In an embodiment, the second color conversion layer 630 may also be omitted. The protection layer 510 and the low refractive index layer 700 may be in direct contact with each other within the third bank opening 503 of the bank 500. The filling material 520 may bury the third bank opening 503 of the bank 500.

In other embodiments, the first color conversion layer 620 and the second color conversion layer 630 may be omitted. The protection layer 510 and the low refractive index layer 700 may be in direct contact in the second bank opening 502 and the third bank opening 503 of the bank 500. Also, the filling material 520 may bury the second bank opening 502 and the third bank opening 503 of the bank 500.

Figure 7A:
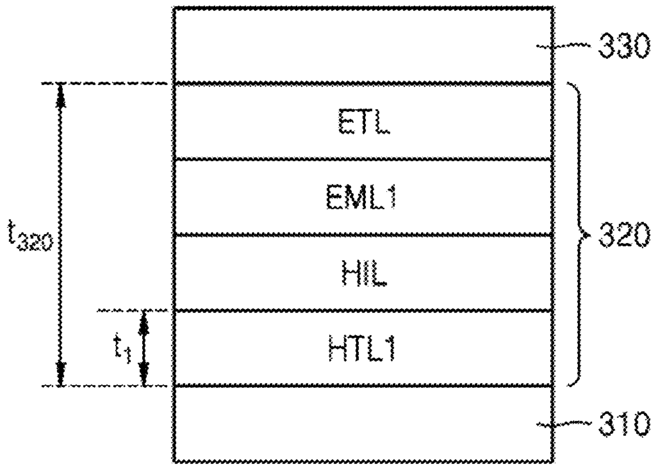
FIGS. 7A, 7B, and 7C are schematic cross-sectional views schematically illustrating an intermediate layer according to embodiments.
Figure 7B:
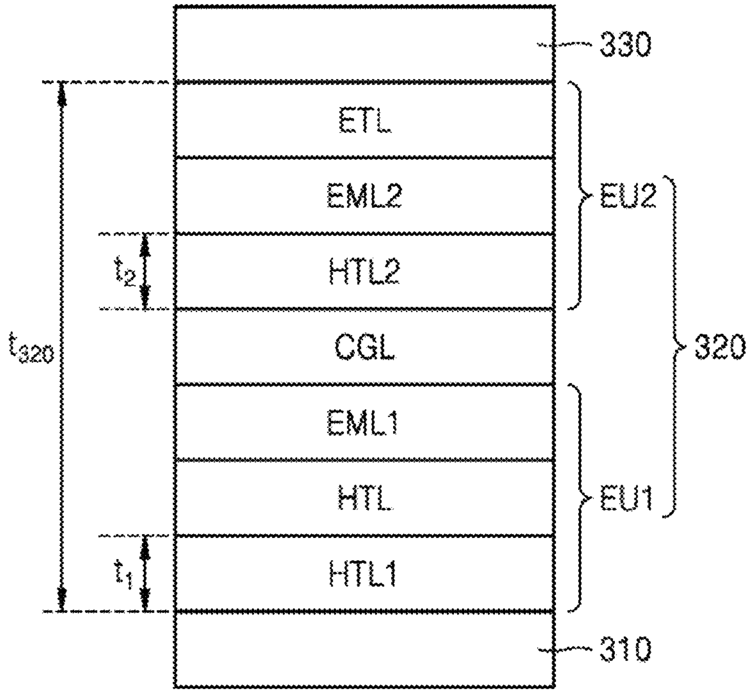
Figure 7C:
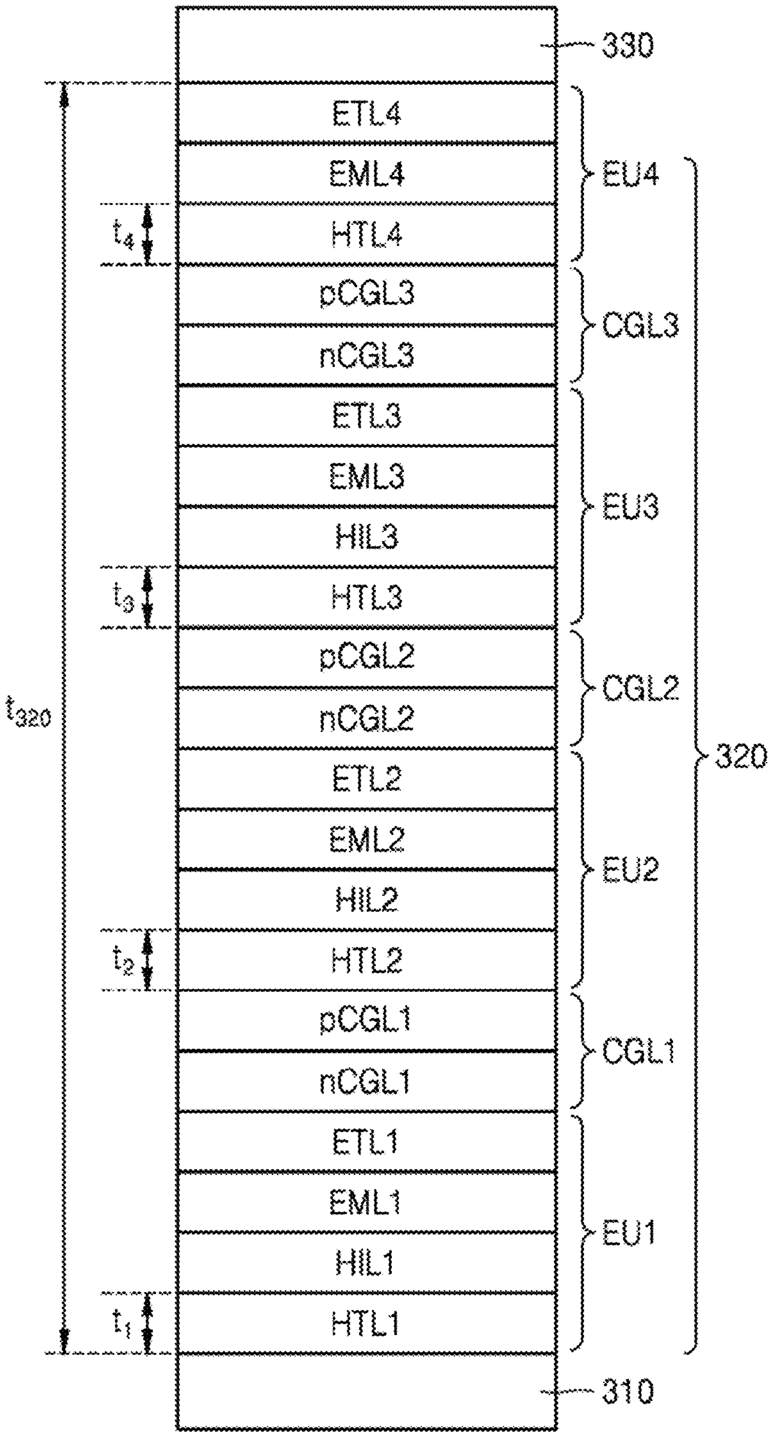

FIGS. 7A, 7B, and 7C are schematic cross-sectional views schematically illustrating an intermediate layer according to embodiments. The light emitting device shown in FIGS. 7A. 7B, and 7C may correspond to one of a first light emitting device (see LED1 of FIG. 5), a second light emitting device (see LED2 of FIG. 5), and a third light emitting device (see LED3 of FIG. 5).

Referring to FIG. 7A, the light emitting device according to an embodiment may include a pixel electrode 310, an opposite electrode 330, and an intermediate layer 320 between the pixel electrode 310 and the opposite electrode 330.

The intermediate layer 320 may include polymer or low molecular organic material that emits light of a given color. The intermediate layer 320 may further include a metal-containing compound such as an organic metal compound, an inorganic material such as quantum dots, in addition to a variety of organic materials.

In an embodiment, the intermediate layer 320 may further include one emission layer and a first functional layer and a second functional layer under or below and on the emission layer. The first functional layer may include, for example, a hole transport layer, or may include a a hole transport layer and a hole injection layer. The second functional layer that is a component disposed on the emission layer, may be optional. The second functional layer may include an electron transport layer and/or an electron injection layer. In this regard, FIG. 7A illustrates a first emission layer EML1, a first functional layer including a first a hole transport layer HTL1 and a first hole injection layer HIL1 disposed under or below the first emission layer EML1, and a second functional layer including an electron transport layer ETL didposed on the first emssion layer EML1.

In an embodiment, the intermediate layer 320 may include two or emitting units sequentially stacked between the pixel electrode 310 and the opposite electrode 330, and a charge generation layer disposed between two emitting units. In case that the intermediate layer 320 may include an emitting unit and a charge generation layer, the light emitting device may be a tandem light emitting device. The light emitting device may have a stack structure of emitting units, thereby improving color purity and light emitting efficiency.

One emission unit may include an emission layer, and a first functional layer and a second functional layer, which are under or below and on the emission layer. The charge generation layer may include a negative charge generation layer and a positive charge generation layer. The light emitting efficiency of a tandem light emitting device including emission layers may be further increased by the negative charge generation layer and the positive charge generation layer. In an embodiment, the emission layer may have a stack structure in which two or layers of a red emission layer, a green emission layer and a blue emission layer are in contact with each other or are spaced apart from each other, or may have a structure in which two or materials of a red light emitting material, a green light emitting material and a blue light emitting material are mixed with each other without layer classification.

The negative charge generation layer may be an n-type charge generation layer negative charge generation layer may supply electrons. The negative charge generation layer may include a host and a dopant. The host may include an organic material. The dopant may include a metal material. The positive charge generation layer may be a p-type charge generation layer. The positive charge generation layer may supply holes. The positive charge generation layer may include a host and a dopant. The host may include an organic material. The dopant may include a metal material.

In an embodiment, as shown in FIG. 7B, the organic light emitting diode (OLED) may include a first emission unit EU1 including the first emission layer EML1 and a second emission unit EU2 including the second emission layer EML2, which may be sequentially stacked each other. A charge generation layer CGL may be provided between the first emission unit EU1 and the second emission unit EU2. For example, the OLED may include a pixel electrode 201, a first emission layer EML1, a charge generation layer CGL, a second emission layer EML2, and an opposite electrode 330, which may be sequentially stacked each other.

The first functional layer and the second functional layer may be included under or below and on the first emission layer EML1, respectively. The first functional layer and the second functional layer may be included under or below and on the second emission layer EML2, respectively. For example, the first emission unit EU1 may include a first hole transport layer HTL1, and the second emission unit EU2 may include a second hole transport layer HTL2. In an embodiment, one of the first hole transport layer HTL1 and the second hole transport layer HTL2 may be omitted The second emission unit EU2 may include an electron transport layer ETL disposed on the second emission layer EML2.

Referring to FIG. 7C, the light emitting device may include a first emssion unit EU1, a second emission unit EU2, a third emission unit EU3, and a fourth emission unit EU4, which may be sequentially stacked each other. A first charge generation layer CGL1 may be provided between the first emisison unit EU1 and the second emission unit EU2, a second charge generation layer CGL2 may be provided between the second emission unit EU2 and the third emission unit EU3, and a third charge generation layer CGL3 may be provided between the third emission unit EU3 and the fourth emission unit EU4. Each of the first charge generation layer CGL1, the second charge generation layer CGL2, and the third charge generation layer CGL3 may include a negative charge generation layer (e.g., nCGL1, nCGL2, and nCGL3) and a positive charge generation layer (e.g., pCGL1, pCGL2, pCGL3).

The first emission unit EU1 may include a first emission layer EML1 and may further include a first hole injection layer HILL and a first hole transport layer HTL1 between the first emission layer EML1 and the pixel electrode 310, and may further include a first ETL1 between the first emission layer EML1 and the negative charge generation layer nCGL1 of the first charge generation layer CGL1. In an embodiment, a p-doping layer may be further included between the first hole injection layer HIL1 and the first hole transport layer HTL1. The p-doping layer may be formed by doping the first hole injection layer HIL1 with a p-type doping material.

The second emission unit EU2 may include a second emission layer EML2 and may further include a second hole injection layer HIL2 and a second hole transport layer HTL2 between the positive charge generation layer pCGL1 of the first charge generation layer CGL1 and the second emission layer EML2, and may further include a second electron transport layer ETL2 between the second emisssion layer EML2 and the negative charge generation layer nCGL2 of the second charge generation layer CGL2

The third emission unit EU3 may include a third emission layer EML3 and may further include a third hole injection layer HIL3 and a third hole transport layer HTL3 between the positive charge generation layer pCGL2 of the second charge generation layer CGL2 and the second emission layer EML2, and may further include a third electron transport layer ETL3 between the third emisssion layer EML3 and the negative charge generation layer nCGL3 of the third charge generation layer CGL3.

The fourth emissoin unit EU4 may include a fourth emission layer EML4, and may further include a fourth hole transport layer HTL4 between the positive positive charge generation layer pCGL3 of the third charge generation layer CGL3 and the fourth emisison layer EML4, and may further include a fourth ETL4. The fourth electron transport layer ETL4 may be a single layer or multiple layers. In an embodiment, at least one of a hole blocking layer and a buffer layer may be further included between the fourth emission layer EML4 and the fourth electron transport layer ETL4. The hole blocking layer may prevent holes from being injected into the fourth electron transport layer ETL4.

In an embodiment, a portion of the first hole transport layer HTL1, the second hole transport layer HTL2, the third hole transport layer HTL3, and the fourth hole transport layer HTL4 may be omitted.

In an embodiment, at least one of the first emission layer EML1, the second emission layer EML2, the third emission layer EML3, and the fourth emission layer EML4 may emit light having a wavelength belonging to a different wavelength band from a light emitted by at least another one of the first emission layer EML1, the second emission layer EML2, the third emission layer EML3, and the fourth emission layer EML4. For example, each of the first emission layer EML1, the second emission layer EML2, and the third emission layer EML3 may emit light (for example, blue light) having a wavelength belonging to about 400 nm to about 500 nm, and the fourth emission layer EML4 may emit light (for example, green light light) having a wavelength belonging to about 500 nm to about 600 nm.

The light emitting device according to the embodiments of the disclosure illustrated in FIGS. 7A, 7B, and 7C may emit light including a long wavelength component and a short wavelength component. Thus, a light-emitting spectrum of first light L0 emitted from the light emitting device may have a widely distributed emission peak. For example, the first light L0 emitted from the light emitting device may have an X-value of 0.220 to 0.222 in the CIE color coordinate and a Y-value of 0.225 to 0.309. A thickness $t_{320}$ of the intermediate layer 320 may be changed to adjust a light-emitting spectrum of the first light L0 emitted from the light emitting device. The thickness $t_{320}$ of the intermediate layer 320 is a distance between a first interface between the pixel electrode 310 and the emission unit disposed in contact with the pixel electrode 310, and a second interface between the opposite electrode 330 and the emission unit disposed in contact with the opposite electrode 330.

In an embodiment, the thicknesses of hole transport layers included in the intermediate layer 320 may be changed to adjust a light-emittion spectrum of first light L0 emitted by a light emitting device. For example, as shown in FIG. 7A, a first thickness $t_1$ of the first hole transport layer HTL1 may be changed to adjust a thickness $t_{320}$ of the intermediate layer 320. By way of example, as shown in FIG. 7B, a first thickness $t_1$ of the first hole transport layer HTL1 and/or a second thickness $t_2$ of the second hole transport layer HTL2 may be changed to adjust a thickness $t_{320}$ of the intermediate layer 320.

By way of example, as shown in FIG. 7C, in case that the intermediate layer 320 may include a first emission unit EU1, a second emission unit EU2, a third emission unit EU3 and a fourth emission unit EU4, each of the first emission unit EU1, the second emission unit EU2 and the third emission unit EU3 may emit light having a wavelength belonging to about 400 nm to about 500 nm and the fourth emission unit EU4 emits light having a wavelength belonging to about 500 nm to about 600 nm, the thickness $t_{320}$ of the intermediate layer 320 may be about 3350 Å to about 3500 Å. The first thickness $t_1$ of the first hole transport layer HTL1, the second thickness $t_2$ of the second hole transport layer HTL2, the third thickness $t_3$ of the third hole transport layer HTL3 and/or the thickness $t_4$ of the fourth hole transport layer HTL4 may be changed to adjust a thickness $t_{320}$ of the intermediate layer 320. Of course, the structure of the intermediate layer 320 may be variously modified in addition to the above-described structure with reference to FIGS. 7A, 7B, and 7C.

Figure 8A:
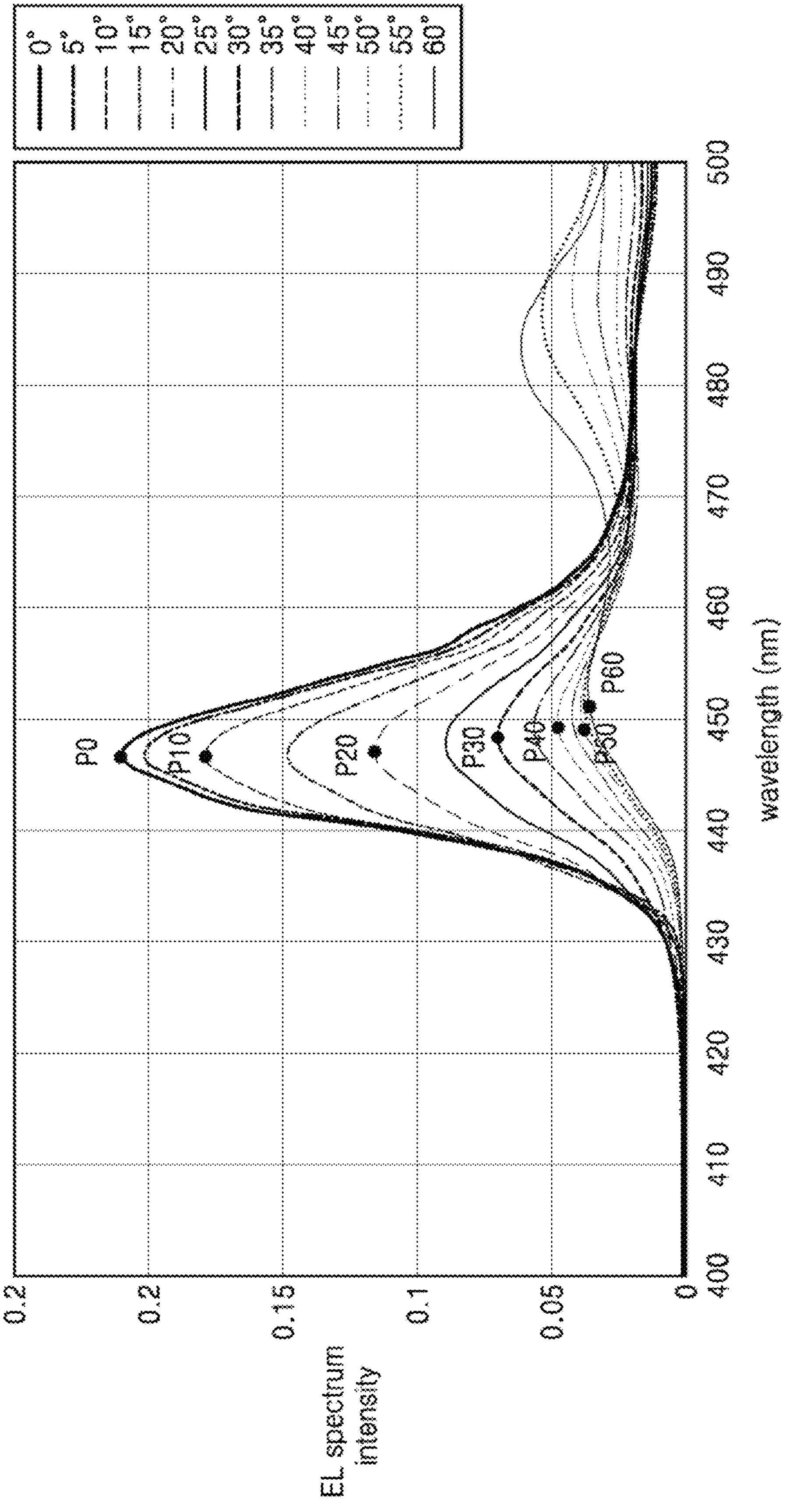
FIGS. 8A, 8B, 8C, and 8D are graphs showing a light-emitting spectrum intensity according to a measurement angle of light emitted by a light-emitting device of the display apparatus according to embodiments.
Figure 8B:
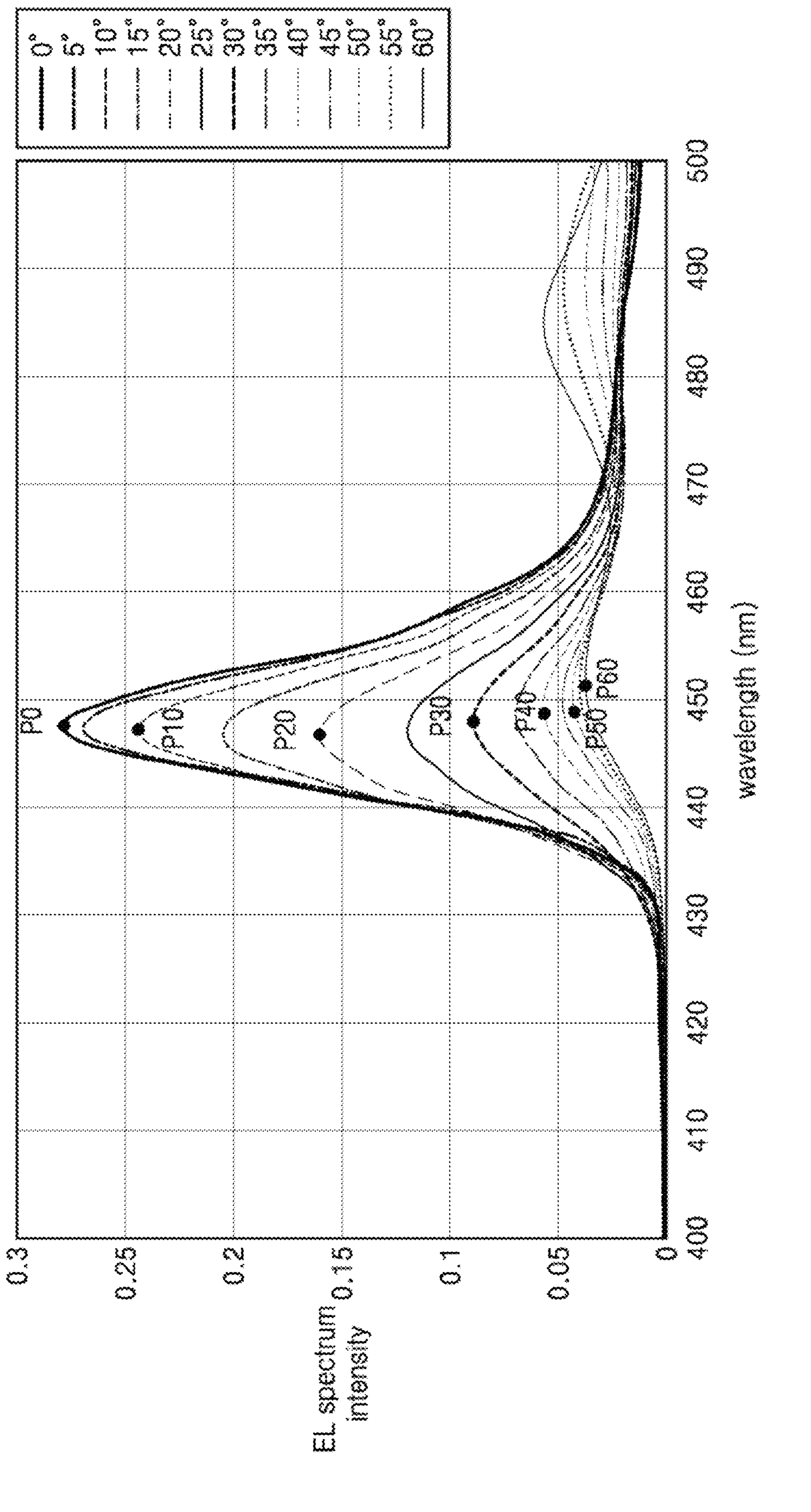
Figure 8C:
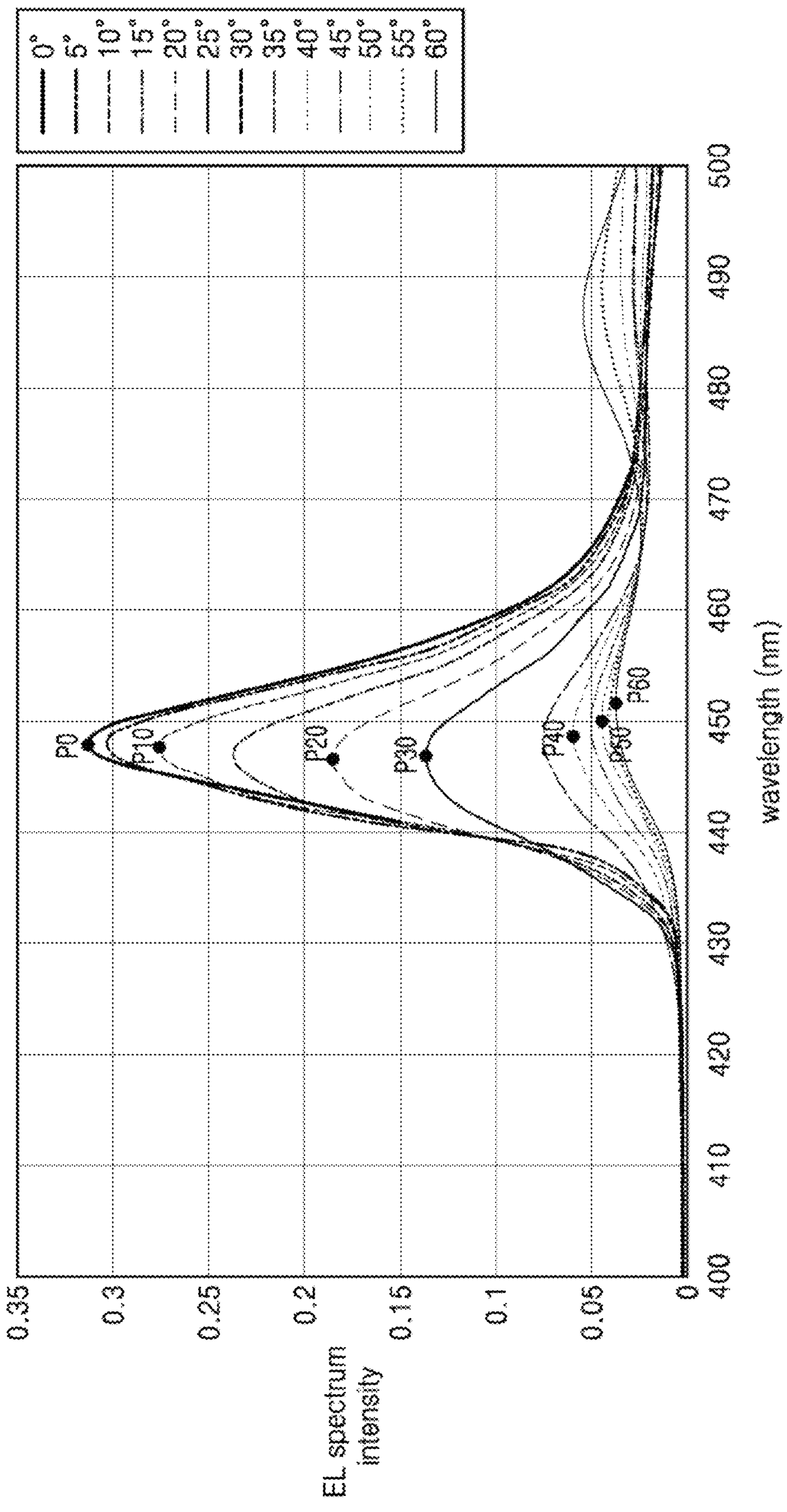
Figure 8D:
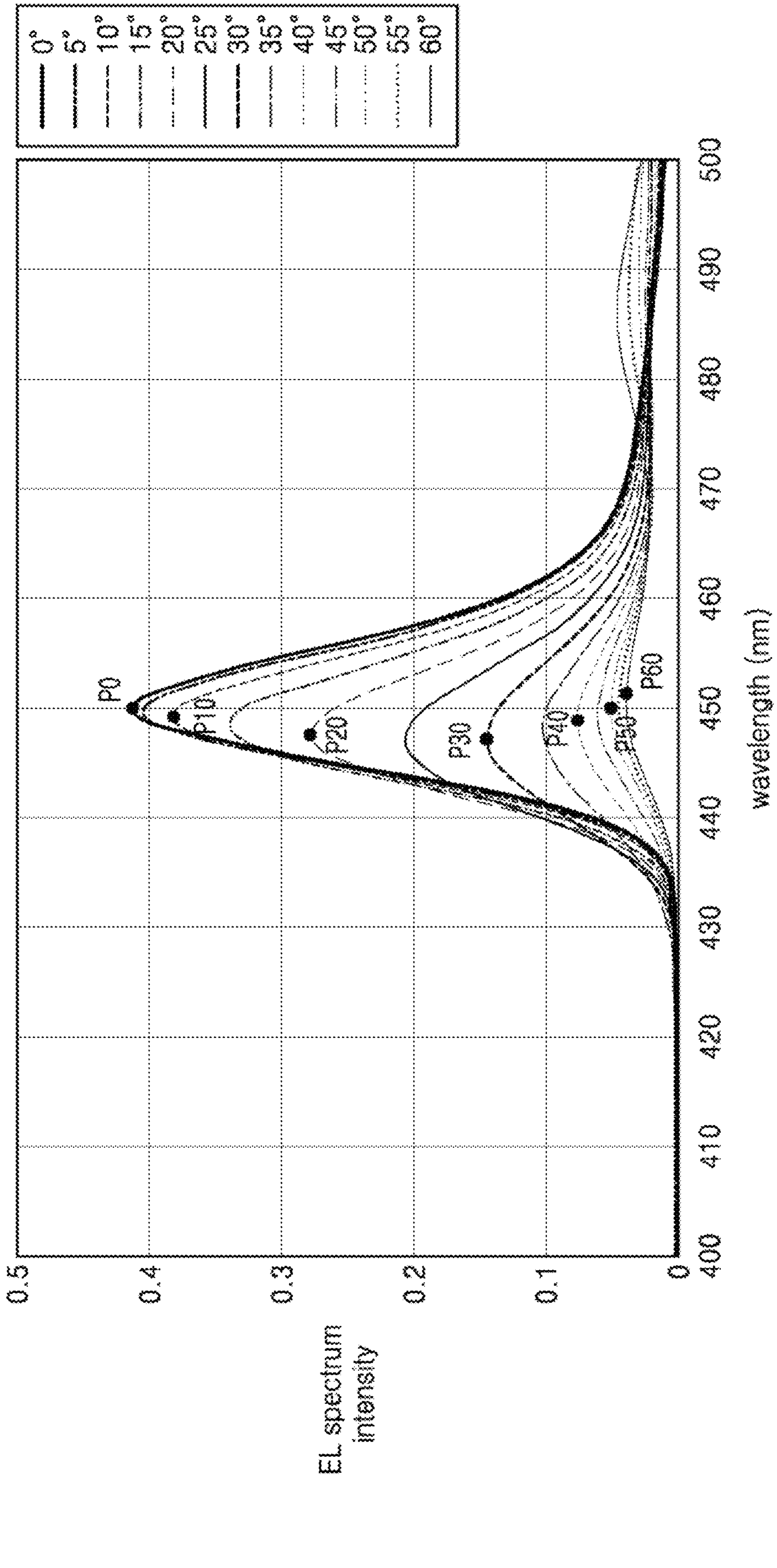
Figure 9A:
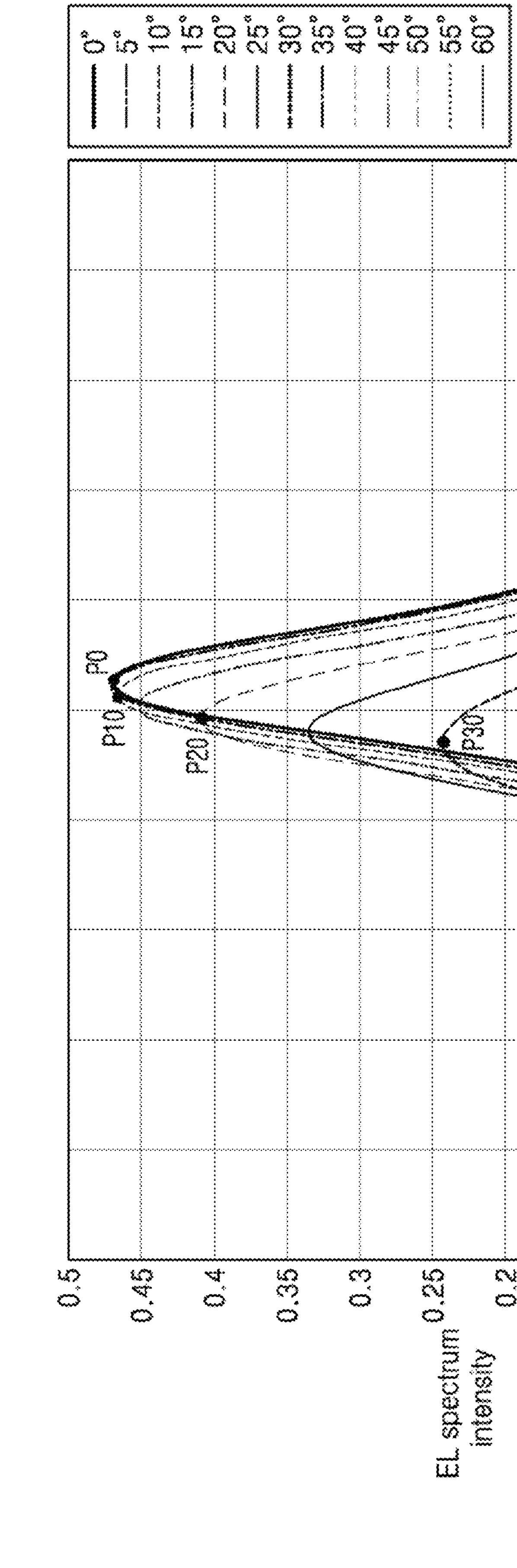
FIGS. 9A, 9B, and 9C are graphs showing a light-emitting spectrum intensity according to a measurement angle of light emitted by a light-emitting device of the display apparatus according to comparative examples.
Figure 9B:
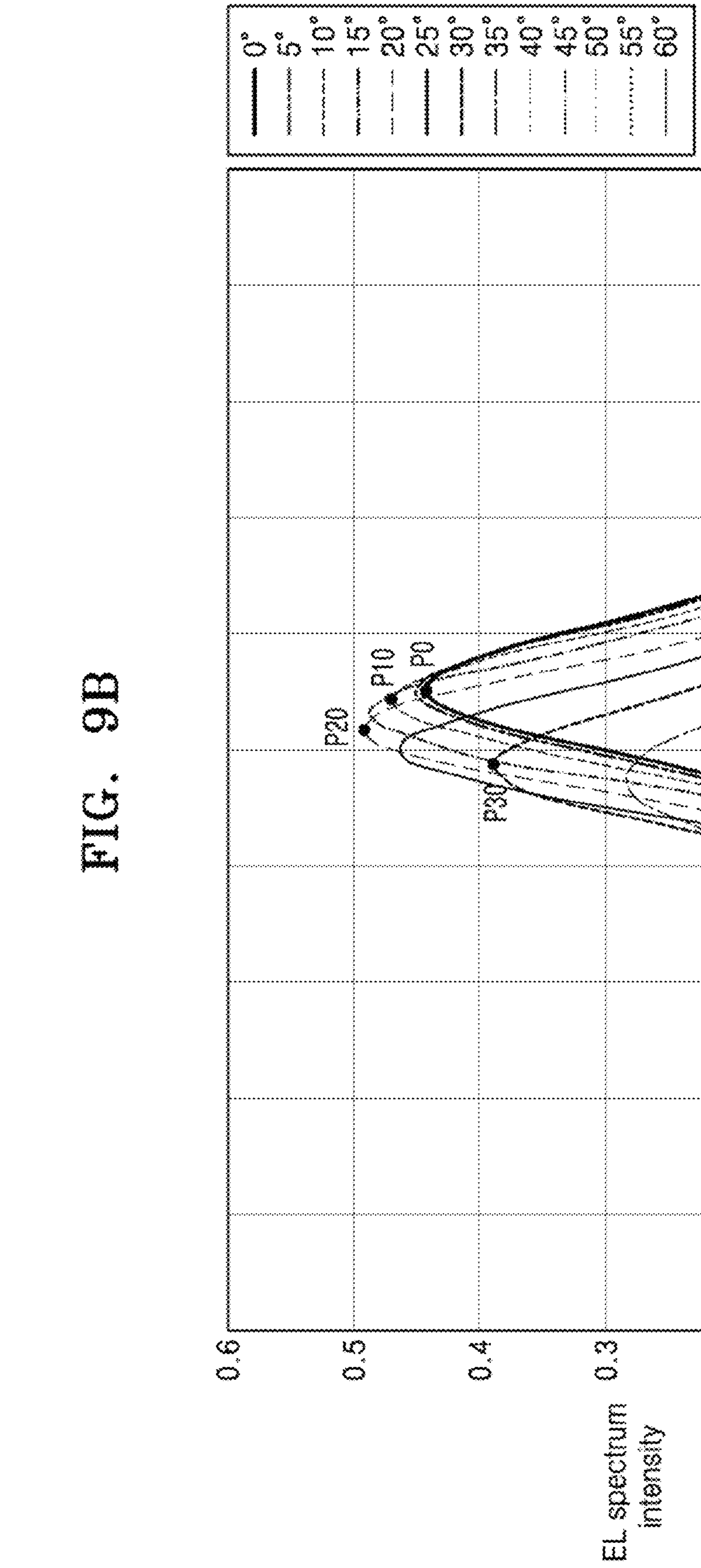
Figure 9C:
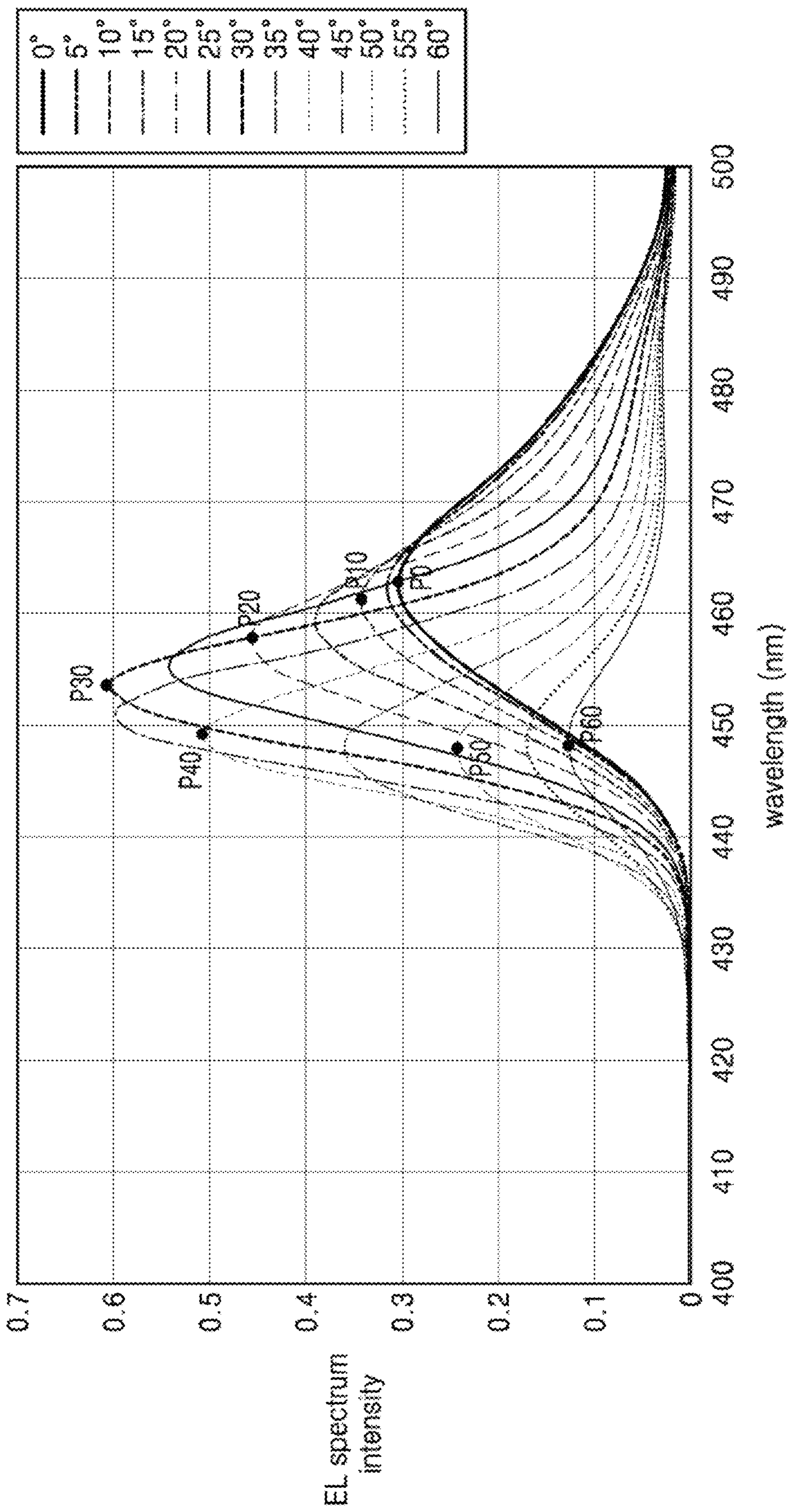

FIGS. 8A, 8B, 8C, and 8D are graphs illustrating a light-emitting spectrum intensity according to a measurement angle of light emitted by a light emitting device of a display apparatus according to embodiments, and FIGS. 9A, 9B, and 9C are graphs illustrating an light-emitting spectrum intensity according to a measurement angle of light emitted by a light emitting device of a display apparatus according to comparative examples. FIG. 10 is a table showing color coordinates, light-emitting efficiency and white light-emitting efficiency of light emitted by each pixel of a display apparatus according to a thickness change of an intermediate layer.

In FIGS. 8A through 8D and FIGS. 9A through 9C, a light-emitting spectrum intensity according to a measurement angle of light emitted by the first light emitting device (see LED1 of FIG. 5) formed on the first substrate (see 100 of FIG. 5) before the first substrate (see 100 of FIG. 5) and the second substrate (see 900 of FIG. 5) are bonded to each other were measured. For example, by increasing the inclination of a detector by 5° with respect to the direction (−z-direction) perpendicular to the first substrate 100, the light-emitting spectrum intensity of the light emitted by the first light emitting device LED1 was measured.

In FIG. 8A, a thickness (see $t_{320}$ of FIG. 7C) of an intermediate layer (see 320 of FIG. 5) of a first light emitting device (see LED1 of FIG. 5) is 3350 Å, and in FIG. 8B, a thickness $t_{320}$ of the intermediate layer 320 of the first light emitting device LED1 is 3400 Å, and in FIG. 8C, a thickness $t_{320}$ of the intermediate layer 320 of the first light emitting device LED1 is 3450 Å, and in FIG. 8D, a thickness $t_{320}$ of the intermediate layer 320 of the first light emitting device LED1 is 3500 Å.

In FIG. 9A, a thickness of an intermediate layer of a first light emitting device is 3550 Å, and in FIG. 9B, a thickness of the intermediate layer of the first light emitting device is 3600 Å, and in FIG. 9C, a thickness of an intermediate layer of the first light emitting device is 3650 Å.

Referring to FIGS. 8A through 8D, a first light (see L0 of FIG. 3) emitted by a first light emitting device LED1 according to embodiments has a first peak value that is a local maximum value in a wavelength band of about 440 nm to about 460 nm, and in case that a measurement angle of a light-emitting spectrum intensity is changed by 5° with respect to a direction (−z-direction) perpendicular to the first substrate 100, the first peak value has a straight line resonance structure that continuously decreases with an increase in a measurement angle.

On the other hand, referring to FIGS. 9A through 9C, the measurement angle of the light-emitting spectrum intensity by 5° with respect to the direction (−z-direction) perpendicular to the first substrate, the first peak value of the light emitted by the first light emitting device according to the comparative examples increases with an increase in the measurement angle and has a decreasing diagonal resonance structure.

For example, referring to FIG. 8A, in case that the measurement angle is 0°, the first peak value P0 is about 0.205, the first peak value P10 in case that the measurement angle is 10° is about 0.174, the first peak value P20 in case that the measurement angle is 20° is about 0.112, the first peak value P30 in case that the measurement angle is 30° is about 0.066, the first peak value P40 in case that the measurement angle is 40° is about 0.042, the first peak value P50 in case that the measurement angle is 40° is about 0.039, and the first peak value P60 in case that the measurement angle is 60° is continuously decreased to about 0.036.

Referring to FIG. 8B, the first peak value P0 in case that the measurement angle is 0° is about 0.278, the first peak value P10 in case that the measurement angle is 10° is about 0.244, the first peak value P20 in case that the measurement angle is 20° is about 0.159, the first peak value P30 in case that the measurement angle is 30° is about 0.088, the first peak value P40 in case that the measurement angle is 40° is about 0.056, the first peak value P50 in case that the measurement angle is 50° is about 0.042, and the first peak value P60 in case that the measurement angle is 60° is continuously decreased to about 0.037.

Referring to FIG. 8C, the first peak value P0 in case that the measurement angle is 0° is about 0.316, the first peak value P10 in case that the measurement angle is 10° is about 0.279, the first peak value P20 in case that the measurement angle is 20° is about 0.186, the first peak value P30 in case that the measurement angle is 30° is about 0.099, the first peak value P40 in case that the measurement angle is 40° is about 0.059, the first peak value P50 in case that the measurement angle is 50° is about 0.043, and the first peak value P60 in case that the measurement angle is 60° is continuously decreased to about 0.036.

Referring to FIG. 8D, the first peak value P0 in case that the measurement angle is 0° is about 0.408, the first peak value P10 in case that the measurement angle is 10° is about 0.381, the first peak value P20 in case that the measurement angle is 20° is about 0.275, the first peak value P30 in case that the measurement angle is 30° is about 0.144, the first peak value P40 in case that the measurement angle is 40° is about 0.076, the first peak value P50 in case that the measurement angle is 50° is about 0.050, and the first peak value P60 in case that the measurement angle is 60° is continuously decreased to about 0.040.

On the other hand, referring to FIG. 9A, the first peak value P0 in case that the measurement angle is 0° is about 0.466, the first peak value in case that the measurement angle is 5° is about 0.469, and the first peak value 10 in case that the measurement angle is 10° is about 0.466, the first peak value increases in a section in which the measurement angle increases from 0° to 5°, and decreases in a section in which the measurement angle increases from 5° to 10 °.

Referring to FIG. 9B, the first peak value P0 in case that the measurement angle is 0° is about 0.444, the first peak value P10 in case that the measurement angle is 10° is about 0.466, and the first peak value P20 in case that the measurement angle is 20° is about 0.489, and the first peak value P30 in case that the measurement angle is 30° is about 0.390, the first peak value increases in a section in which the measurement angle increases from 0° to 20°, and decreases in a section in which the measurement angle increases from 20° to 30 °.

Referring to FIG. 9C, the first peak value P0 in case that the measurement angle is 0° is about 0.303, the first peak value P10 in case that the measurement angle is 10° is about 0.341, and the first peak value P20 in case that the measurement angle is 20° is about 0.456, and the first peak value P30 in case that the measurement angle is 30° is about 0.598, and the first peak value P40 in case that the measurement angle is 40° is about 0.505, and the first peak value increases in a section in which the measurement angle increases from 0° to 30°, and decreases in a section in which the measurement angle increases from 30° to 40 °.

FIG. 10 is a table showing color coordinates, light-emitting efficiency and white light-emitting efficiency of light emitted by each pixel of a display apparatus. Each pixel may include a light emitting element, a color conversion layer, and a color filter, and the color coordinates and luminous efficiency of the light emitted from the light emitting element are measured after the light passes through the corresponding color conversion layer and the color filter. Here, R_x and R_y are CIE color coordinate values of the red pixel, G_x and G_y are CIE color coordinate values of the green pixel, and B_x and B_y are CIE color coordinate values of the blue pixel. R_Eff, G_Eff, and B_Eff are the emission efficiency of the red pixel, the emission efficiency of the green pixel, and the emission efficiency of the blue pixel, respectively, and B_con is the conversion emission efficiency of the blue pixel. W_Eff is white light-emitting efficiency.

Referring to FIGS. 8A through 8D and 10, the thickness t320 of the intermediate layer is in a range of about 3350 Å to about 3500 Å, and in case that the light emitting device has a linear resonance structure, the white light emitting efficiency of the display device is 22.4 or more. In case that the thickness t320 of the intermediate layer is about 3450 Å, the white light emitting efficiency of the display device has a maximum value of 22.7.

In case that the white light emission efficiency of the display device is converted to 100% in case that the thickness $t_{320}$ of the intermediate layer is about 3450 Å, white light-emitting efficiency decreases to 96% or less in case that the thickness $t_{320}$ of the intermediate layer is increased to about 3550 Å or more, and the light-emitting element has a diagonal resonance structure such as that shown in FIGS. 9A through 9C. Similarly, in case that the thickness $t_{320}$ of the intermediate layer decreases to about 3300 Å or less, white light-emitting efficiency rapidly decreases to about 90.7% or less.

Figure 11:
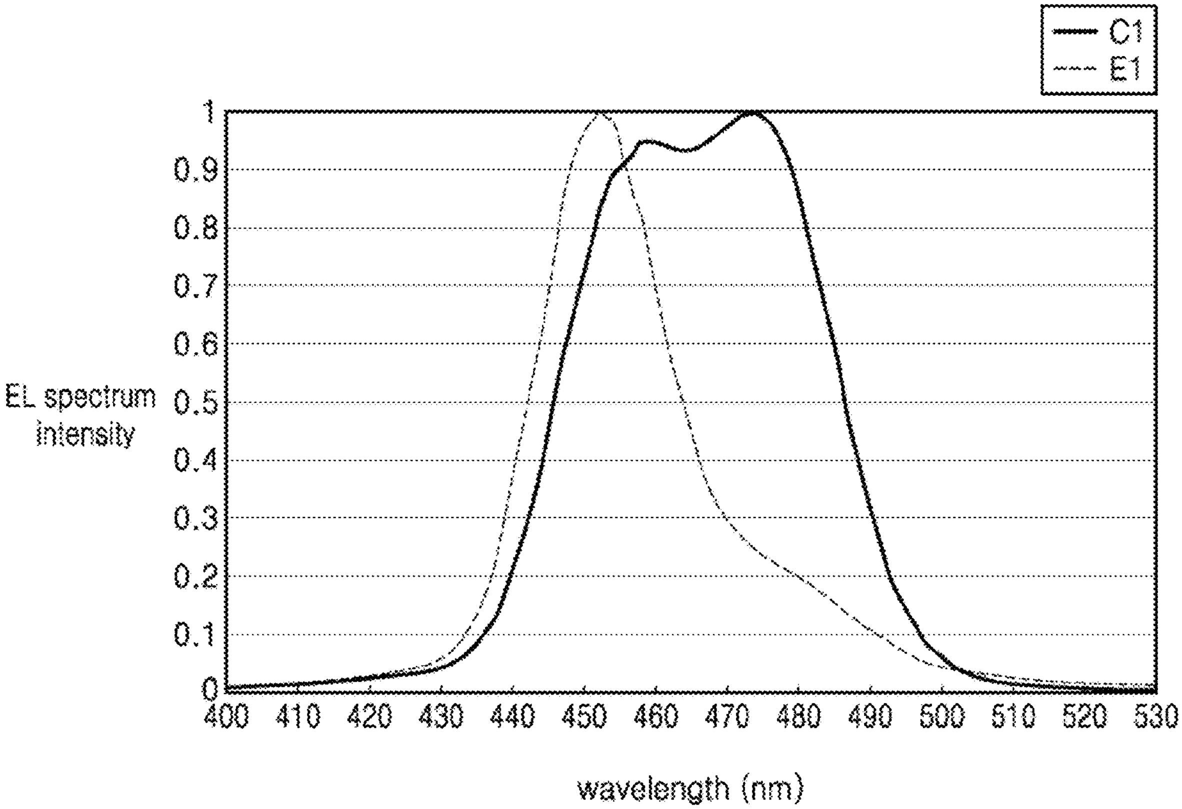
FIG. 11 is a graph showing a light-emitting spectrum intensity of light emitted by a first pixel of a display apparatus according to an embodiment and a light-emitting spectrum intensity of light emitted by a first pixel of a display apparatus according to a comparative example.

FIG. 11 is a graph showing a light-emitting spectrum intensity of light emitted by a first pixel of a display apparatus according to an embodiment and a light-emitting spectrum intensity of light emitted by a first pixel of a display apparatus according to a comparative example. In FIG. 11, a first substrate (see 100 of FIG. 5) and a second substrate (see 900 of FIG. 5) are bonded to each other, and light emitted from a first light emitting device (see LED1 of FIG. 5) passes through an organic material layer (see 610 of FIG. 5) and a first color filter layer (see 810 of FIG. 5) to measure an light-emitting spectrum intensity of the emitted light.

In FIG. 11, a thickness $t_{320}$ of an intermediate layer of a first pixel according to Embodiment E1 is about 3450 Å, and a thickness of an intermediate layer of a first pixel according to Comparative example C1 is about 3700 Å.

The emission spectrum intensity of Comparative example C1 has two peaks separated at about 456 nm and about 475 nm. On the other hand, the intensity of the emission spectrum of Embodiment E1 decreases the intensity of the peak at about 475 nm, and the peak at about 456 nm moves to about 453 nm and merges into one peak. In case that the light emitting spectrum intensity of the light emitted from the first pixel has separated peaks as in Comparative example C1, the conversion emission efficiency of the first pixel is low to about 115.4, whereas, in case that the light emission spectrum intensity of the light emitted by the first pixel has one peak, as in Embodiment E1, the conversion emission efficiency of the first pixel is high to about 209.6.

Figure 13:
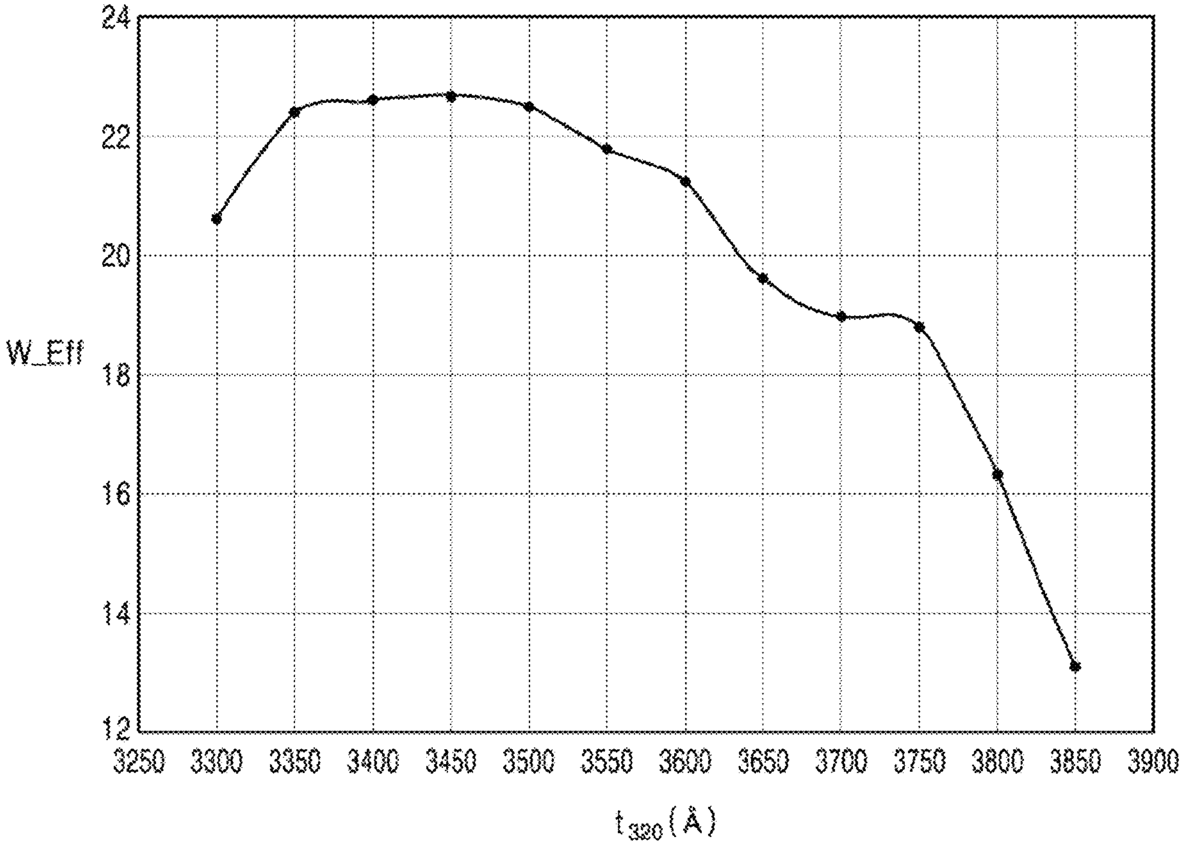
FIG. 13 is a graph showing white light-emitting efficiency of a display apparatus according to a thickness change of an intermediate layer.

FIG. 12 is a graph showing light source color coordinates and white light-emitting efficiency of a display apparatus according to a thickness change of an intermediate layer, and FIG. 13 is a graph showing white light-emitting efficiency of a display apparatus according to a thickness change of an intermediate layer.

In FIGS. 12 and 13, before the first substrate (see 100 of FIG. 5) and the second substrate (see 900 of FIG. 5) are bonded to each other, CIE color coordinates of a first light emitting device (see LED1 of FIG. 5) formed on the first substrate (see 100 of FIG. 5) are measured, and, white light-emitting efficiency of the display apparatus is measured by bonding the first substrate 100 and the second substrate 900 to each other. In FIG. 12, CIEx and CIEy are light source color coordinates of the display device.

Referring to FIGS. 12 and 13, the thickness $t_{320}$ of the intermediate layer is about 3350 Å to about 3500 Å, and the light emitted from the first light emitting device has an X value of about 0.220 to about 0.222 in the CIE color coordinate and a Y value of about 0.225 to about 0.309 in case that the light emitting device has a linear resonance structure.

In case that the thickness $t_{320}$ of the intermediate layer is about 3450 Å, the white light-emitting efficiency of the display apparatus has a maximum value of about 22.7, and in case that the thickness $t_{320}$ of the intermediate layer increases to about 3550 Å or more, the white light-emitting efficiency decreases to about 21.8 or less. Similarly, in case that the thickness $t_{320}$ of the intermediate layer decreases to about 3300 Å or less, white light-emitting efficiency rapidly decreases to about 20.6 or less.

According to embodiments, a display apparatus in which high-quality images are displayed may be implemented. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope and as defined by the following claims.

What is claimed is:

1. A display apparatus comprising:

a first pixel electrode and a second pixel electrode disposed on a substrate;

an intermediate layer disposed on the first pixel electrode and the second pixel electrode and that emits first light;

an opposite electrode disposed on the intermediate layer;

a first color filter disposed on the opposite electrode and overlapping the first pixel electrode in plan view;

an organic material layer disposed between the opposite electrode and the first color filter; and a second color filter disposed on the opposite electrode and overlapping the second pixel electrode in plan view, wherein the first light has an X-value in a range of about 0.220 to about 0.222 and a Y-value in a range of about 0.225 to about 0.309 in CIE color coordinates, and the first light passes through the organic material layer along a substantially linear path.

2. The display apparatus of claim 1, wherein a light-emitting spectrum intensity of the first light has a first peak value that is a local maximum value in a wavelength band in a range of about 440 nm to about 460 nm, and in case that a measurement angle of the a light-emitting spectrum intensity is changed based on a direction perpendicular to the substrate, the first peak value continuously decreases according to an increase of the measurement angle.

3. The display apparatus of claim 1, wherein the first color filter comprises scattering particles.

4. The display apparatus of claim 1, further comprising:

an encapsulation layer disposed on the opposite electrode and comprising at least one inorganic encapsulation layer and at least one organic encapsulation layer, wherein a refractive index of the organic material layer is substantially equal to a refractive index of the organic encapsulation layer.

5. The display apparatus of claim 4, further comprising:

a filling material disposed between the encapsulation layer, and the first color filter and the second color filter; and a protection layer disposed between the organic material layer and the filling material.

6. The display apparatus of claim 4, further comprising:

a filling material disposed between the encapsulation layer, and the first color filter, and the second color filter, wherein the organic material layer is integral with the filling material.

7. The display apparatus of claim 1, wherein the intermediate layer comprises a first emission layer, a second emission layer, a third emission layer, and a fourth emission layer, and the first emission layer, the second emission layer, and the third emission layer emit blue light, and the fourth emission layer emits green light.

8. The display apparatus of claim 7, wherein each of the first emission layer, the second emission layer and the third emission layer emits a light of a wavelength in a range of about 400 nm to about 500 nm, and the fourth emission layer emits light having a wavelength in a range of about 500 nm to about 600 nm.

9. The display apparatus of claim 6, wherein the intermediate layer comprises at least one hole injection layer, and a distance between a first interface between the first pixel electrode and the intermediate layer and a second interface between the intermediate layer and the opposite electrode is in a range of about 3350 Å to about 3500 Å.

10. The display apparatus of claim 1, further comprising:

a first color conversion layer disposed between the opposite electrode and the second color filter and that converts the first light into light having a wavelength of a second wavelength band, wherein the first color filter passes through only light having a wavelength of a first wavelength band, and the second color filter passes through only the light having the wavelength of the second wavelength band.

11. The display apparatus of claim 10, further comprising:

a third pixel electrode disposed on the substrate; and a third color filter disposed on the opposite electrode to overlap the third pixel electrode in plan view and passes through only light having a wavelength of a third wavelength band.

12. The display apparatus of claim 11, further comprising:

a second color conversion layer disposed between the opposite electrode and the third color filter and that converts the first light into the light having the wavelength of a third wavelength band.

13. The display apparatus of claim 11, wherein the third color filter comprises scattering particles.

14. A display apparatus comprising:

a first pixel electrode and a second pixel electrode disposed on a first substrate;

an intermediate layer disposed on the first pixel electrode and the second pixel electrode and that emits first light;

an opposite electrode disposed on the intermediate layer;

a second substrate disposed above the first substrate with the opposite electrode disposed between the first substrate and the second substrate;

a bank disposed on a lower surface of the second substrate in a direction of the first substrate and having a first bank opening overlapping the first pixel electrode in plan view and a second bank opening overlapping the second pixel electrode in plan view;

a first color filter disposed between the bank and the second substrate and overlapping the first pixel electrode in plan view;

an organic material layer disposed between the opposite electrode and the first color filter; and a second color filter disposed between the bank and the second substrate and overlapping the second pixel electrode in plan view, wherein the first light has an X-value in a range of about 0.220 to about 0.222 and a Y-value of 0.225 to 0.309 in CIE color coordinates, and the first light passes through the organic material layer along a substantially linear path.

15. The display apparatus of claim 14, wherein an light-emitting spectrum intensity of the first light has a first peak value that is a local maximum value in a wavelength band in a range of about 440 nm to about 460 nm, and in case that a measurement angle of the light-emitting spectrum intensity is changed based on a direction perpendicular to the first substrate, the first peak value continuously decreases according to an increase of the measurement angle.

16. The display apparatus of claim 14, wherein the first color filter comprises scattering particles.

17. The display apparatus of claim 14, further comprising:

an encapsulation layer disposed on the opposite electrode and comprising at least one inorganic encapsulation layer and at least one organic encapsulation layer, wherein a refractive index of the organic material layer is substantially equal to a refractive index of the organic encapsulation layer.

18. The display apparatus of claim 14, wherein the intermediate layer comprises a first emission layer, a second emission layer, a third emission layer, and a fourth emission layer, and the first emission layer, the second emission layer, and the third emission layer emit blue light, and the fourth emission layer emits green light.

19. The display apparatus of claim 18, wherein each of the first emission layer, the second emission layer and the third emission layer emits light having a maximum emission wavelength in a range of about 400 nm to about 500 nm, and the fourth emission layer emits light having a maximum emission wavelength in a range of about 500 nm to about 600 nm.

20. The display apparatus of claim 18, wherein the intermediate layer comprises at least one hole injection layer, and a distance between a first interface between the first pixel electrode and the intermediate layer and a second interface between the intermediate layer and the opposite electrode is in a range of about 3350 Å to about 3500 Å.

21. The display apparatus of claim 14, further comprising:

a filling material disposed between the first color filter and the second color filter, and the opposite electrode, wherein the organic material layer is integral with the filling material.

22. The display apparatus of claim 21, wherein the filling material is disposed in the first bank opening.

* * * * *